US009135986B2

(12) United States Patent
Shu et al.

(10) Patent No.: US 9,135,986 B2
(45) Date of Patent: *Sep. 15, 2015

(54) SYSTEMS AND METHODS OF SECTIONED BIT LINE MEMORY ARRAYS, INCLUDING HIERARCHICAL AND/OR OTHER FEATURES

(71) Applicant: GSI Technology Inc., Sunnyvale, CA (US)

(72) Inventors: Lee-Lean Shu, Los Altos, CA (US); Chenming W. Tung, Fremont, CA (US); Hsin You S. Lee, Campbell, CA (US)

(73) Assignee: GSI Technology, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/091,290

(22) Filed: Nov. 26, 2013

(65) Prior Publication Data
US 2014/0219011 A1 Aug. 7, 2014

Related U.S. Application Data

(63) Continuation of application No. 13/399,986, filed on Feb. 17, 2012, now Pat. No. 8,693,236, and a continuation of application No. PCT/US2012/068833, filed on Dec. 10, 2012, and a continuation-in-part of application No. 13/316,391, filed on Dec. 9, 2011, now Pat. No. 8,593,860.

(51) Int. Cl.
*G11C 11/41* (2006.01)
*G11C 11/412* (2006.01)
(Continued)

(52) U.S. Cl.
CPC .............. *G11C 11/412* (2013.01); *G11C 5/063* (2013.01); *G11C 7/12* (2013.01); *G11C 7/18* (2013.01); *G11C 11/419* (2013.01); *G11C 5/06* (2013.01); *G11C 7/06* (2013.01)

(58) Field of Classification Search
CPC ............ G11C 5/06; G11C 5/063; G11C 7/06; G11C 7/1051; G11C 7/12; G11C 7/01; G11C 11/41; G11C 11/412; G11C 11/4198
USPC ................... 365/154, 63, 72, 185.11, 189.05, 365/189.16, 190, 207, 230.03
See application file for complete search history.

(56) References Cited

U.S. PATENT DOCUMENTS 4,839,862 A   6/1989  Shiba et al.
5,291,444 A   3/1994  Scott et al.
(Continued)

FOREIGN PATENT DOCUMENTS

EP   0 834 881 A1   4/1998
JP   11-185468 A    7/1999
(Continued)

OTHER PUBLICATIONS

PCT International Search Report of PCT/US12/68833; dated Apr. 23, 2013 (4 pgs.).
(Continued)

*Primary Examiner* — Tan T. Nguyen
(74) *Attorney, Agent, or Firm* — DLA Piper LLP (US)

(57) ABSTRACT

A sectioned bit line of an SRAM memory device, an SRAM memory device having a sectioned bit line, and associated systems and methods are described, including embodiments having sectioned bit lines with hierarchical aspects. In one illustrative implementation, each sectioned bit line may comprise a local bit line, a memory cell connected to the local bit line, and a pass gate coupled to the local bit line, wherein the pass gate is configured to be coupled to a global bit line. Further, in some embodiments, the sectioned bit lines are arranged in hierarchical arrays. In other implementations, SRAM memory devices may be configured involving sectioned bit lines (including hierarchical) and a global bit line wherein the pass gates are configured to connect and isolate the sectioned bit line and the global bit line.

56 Claims, 28 Drawing Sheets

(51) Int. Cl.
*G11C 5/06* (2006.01)
*G11C 7/12* (2006.01)
*G11C 7/18* (2006.01)
*G11C 11/419* (2006.01)
*G11C 7/06* (2006.01)

(56) References Cited

U.S. PATENT DOCUMENTS

| | | | |
|---|---|---|---|
| 5,355,343 A | 10/1994 | Shu et al. | |
| 5,914,906 A | 6/1999 | Iadanza et al. | |
| 5,923,605 A | 7/1999 | Mueller et al. | |
| 5,949,732 A | 9/1999 | Kirihata | |
| 6,091,629 A | 7/2000 | Osada et al. | |
| 6,452,851 B1 | 9/2002 | Endo et al. | |
| 6,522,565 B2 | 2/2003 | Shimazaki et al. | |
| 6,665,204 B2 | 12/2003 | Takeda | |
| 6,674,678 B2 | 1/2004 | Kato | |
| 6,760,243 B2 * | 7/2004 | Winograd et al. | 365/63 |
| 6,901,017 B2 | 5/2005 | Shimizu | |
| 6,930,902 B2 | 8/2005 | Mayer et al. | |
| 6,930,941 B2 * | 8/2005 | Nakase | 365/205 |
| 7,061,802 B2 | 6/2006 | Nakai | |
| 7,102,928 B2 | 9/2006 | Kawamura | |
| 7,102,946 B2 | 9/2006 | Pelella | |
| 7,313,023 B2 | 12/2007 | Li et al. | |
| 7,352,645 B2 | 4/2008 | Sforzin et al. | |
| 7,376,027 B1 | 5/2008 | Chung et al. | |
| 7,433,259 B2 | 10/2008 | Imai et al. | |
| 7,561,462 B2 | 7/2009 | Hsu | |
| 7,616,512 B2 | 11/2009 | Kim et al. | |
| 7,663,942 B2 | 2/2010 | Kushida | |
| 7,701,794 B2 | 4/2010 | Kajigaya | |
| 7,719,909 B2 | 5/2010 | Chung et al. | |
| 7,733,683 B2 | 6/2010 | Takashima et al. | |
| 7,733,711 B2 | 6/2010 | Burnett et al. | |
| 7,885,138 B2 | 2/2011 | Kim et al. | |
| 7,933,160 B2 | 4/2011 | Kim | |
| 7,952,946 B2 | 5/2011 | Kengeri et al. | |
| 7,990,755 B2 | 8/2011 | Kim | |
| 8,014,211 B2 | 9/2011 | Hess et al. | |
| 8,116,149 B2 | 2/2012 | Chen et al. | |
| 8,324,931 B2 | 12/2012 | Voogel et al. | |
| 8,693,236 B2 * | 4/2014 | Shu et al. | 365/154 |
| 2004/0037139 A1 | 2/2004 | Shimizu | |
| 2004/0130926 A1 | 7/2004 | Nakase | |
| 2005/0213366 A1 | 9/2005 | Kang | |
| 2006/0062061 A1 | 3/2006 | Suh et al. | |
| 2008/0080259 A1 | 4/2008 | Buettner et al. | |
| 2008/0130383 A1 | 6/2008 | Kushida | |
| 2008/0180984 A1 | 7/2008 | Takashima et al. | |
| 2009/0116285 A1 | 5/2009 | Youn | |
| 2009/0147561 A1 | 6/2009 | Sasaki et al. | |
| 2009/0175113 A1 | 7/2009 | Deng et al. | |
| 2009/0273961 A1 | 11/2009 | Ono et al. | |
| 2010/0165749 A1 | 7/2010 | Wu et al. | |
| 2010/0260002 A1 | 10/2010 | Chen et al. | |
| 2010/0290305 A1 | 11/2010 | Rao et al. | |
| 2011/0026348 A1 | 2/2011 | Narui | |
| 2011/0188281 A1 | 8/2011 | Siau et al. | |
| 2011/0188311 A1 | 8/2011 | Stiegler et al. | |
| 2011/0199835 A1 | 8/2011 | Kengeri et al. | |
| 2012/0314520 A1 | 12/2012 | Vogelsang et al. | |

FOREIGN PATENT DOCUMENTS

| | | |
|---|---|---|
| JP | 2008-171525 A | 7/2008 |
| JP | 2008-198243 A | 8/2008 |
| JP | 2011-034615 A | 2/2011 |
| KR | 2001-0065694 A | 7/2001 |

OTHER PUBLICATIONS

PCT Written Opinion of the International Searching Authority of PCT/US12/68833; dated Apr. 23, 2013 (12 pgs.).
PCT International Preliminary Report on Patentability of PCT/US12/68833; dated Jun. 10, 2014 (1 pg.).
Extended European Search Report received in corresponding EP application No. 12856183.4, dated Jul. 7, 2015, 6 pgs.

* cited by examiner

4x4 Mcell Array with GBL and local bit line

SYSTEMS AND METHODS OF SECTIONED BIT LINE MEMORY ARRAYS, INCLUDING HIERARCHICAL AND/OR OTHER FEATURES

CROSS-REFERENCE TO RELATED APPLICATION INFORMATION

This is a continuation (bypass) of application No. PCT/US12/68833, filed Dec. 10, 2012, published as WO2013/086538A1, and a continuation of application Ser. No. 13/399,986, filed Feb. 17, 2012, published as US2013/0148415A1, now U.S. Pat. No. 8,693,236, and a continuation-in-part of application Ser. No. 13/316,391, filed Dec. 9, 2011, published as US2013/0148414A1, now U.S. Pat. No. 8,593,860, all of which are incorporated herein by reference in entirety.

BACKGROUND

1. Field

The innovations herein relate to static random access memory, and, more particularly, to systems and methods relating to SRAMs involving sectioned bit lines in memory arrays, including embodiments arranged in hierarchical manner.

2. Description of Related Information

In high density static memory arrays, considerable effort is directed towards minimizing bit line capacitance. Bit line capacitance affects the speed of memory cell sensing and overall stability of memory cells. One way to reduce bit line capacitance is to reduce memory cell size, which is sometimes feasible though is subject to technological limitations. By reducing the memory cell size, the bit line is shortened but the memory cell active current is also reduced. Consequently, the overall performance of memory array may generally stay about the same. Performance may also be improved by reducing the number of memory cells on any given bit line. However, known practices in conventional SRAMs that maintain sensing speed typically entail reducing memory arrays density, which yields larger array area(s). Overall, such existing systems and methods suffer drawbacks relating to the failure to achieve smaller bit line capacitance in desired higher density memory arrays.

Other known systems and methods, such as with some DRAMs and folded bit line structures used in conventional DRAM, may include local bit line connected to gates of access transistors that pass representations of the local bit line onto a global bit line. However, such existing systems and methods may have one or more of a variety of drawback, such as being limited to having very small quantities of memory cells per bit line and thus very short bit lines due to their reduced sensing capability. Voltage swings associated with the bit lines of such systems and methods also tend to be large because of threshold voltage of gate. Further, such systems also suffer drawbacks related to the pass gates being gate-connected the local bit line, to passing an inverse of the signal on the local bit line, and/or to being pre-charged to high instead of low.

Moreover, DRAM implementations and folded bit line structures used in the conventional DRAM relate to a variety of disparate structural or operational issues and/or restrictions. For one, bit lines are typically charged to half Vcc in DRAM. Further, for example, folded bit line structures associated with conventional DRAMs are limited to two pairs of bit lines arranged on either side of the relevant sense amplifier. Also, due to the destructive nature of DRAM cell reading, various DRAM cells need to be sensed once a memory cell is turned on. Accordingly, there can only be one DRAM cell selected for every sense amplifier. Hence, as there can only be one memory cell selected on either the true bit line or the complement bit line, disparate issues associated with selecting memory cells on both at the same time are not present. Moreover, with DRAM, the word lines are not shared by the memory cells on the true bit line and complement bit line. In a hierarchical bit line DRAM, for example, when one memory cell is selected on the true local bit line, there can be no memory cell selected on the complement local bit line at the same time. And no issues related to selection of pass gates coupling the complement local bit lines and the complement global bit lines are present, either. The complement global bit line, e.g., is simply used as a sensing reference in some cases. As such, among the other issues noted above, no design considerations relating to selecting more than only the pass gate on the true local bit line are encountered/overcome.

In sum, as detailed in the innovations below, there is a need for the present systems and methods that may achieve smaller bit line capacitance, improved memory cell stability and/or higher density memory arrays.

BRIEF DESCRIPTION OF THE DRAWINGS

The accompanying drawings, which constitute a part of this specification, illustrate various implementations and features of the present inventions and, together with the description, help explain aspects of the innovations herein. In the drawings.

DETAILED DESCRIPTION OF ILLUSTRATIVE IMPLEMENTATIONS

Reference will now be made in detail to the innovations herein, examples of which are illustrated in the accompanying drawings. The implementations set forth in the following description do not represent all implementations consistent with the claimed invention. Instead, they are merely some examples consistent with certain aspects related to the present innovations. Wherever possible, the same reference numbers will be used throughout the drawings to refer to the same or like parts.

Systems and methods relating to a static random access memory (SRAM) including one or more sectioned bit lines (SBLs) are described. A plurality of SBLs may be provided and may all be in communication with a global bit line (GBL). Each sectioned bit line may also be in communication with one or more individual memory cells. Among other things, configurations consistent with the innovations herein may provide reduced bit line capacitance of the GBLs compared to prior configurations having the same number of memory cells.

Further, in some implementations, each of a plurality of memory cells that are associated with an SBL may connect onto true and complement local bit lines of the SBL. Each of the local bit lines may couple to a pass gate that may act as a conductor and isolator of the SBL to the GBL.

Figure 1A:
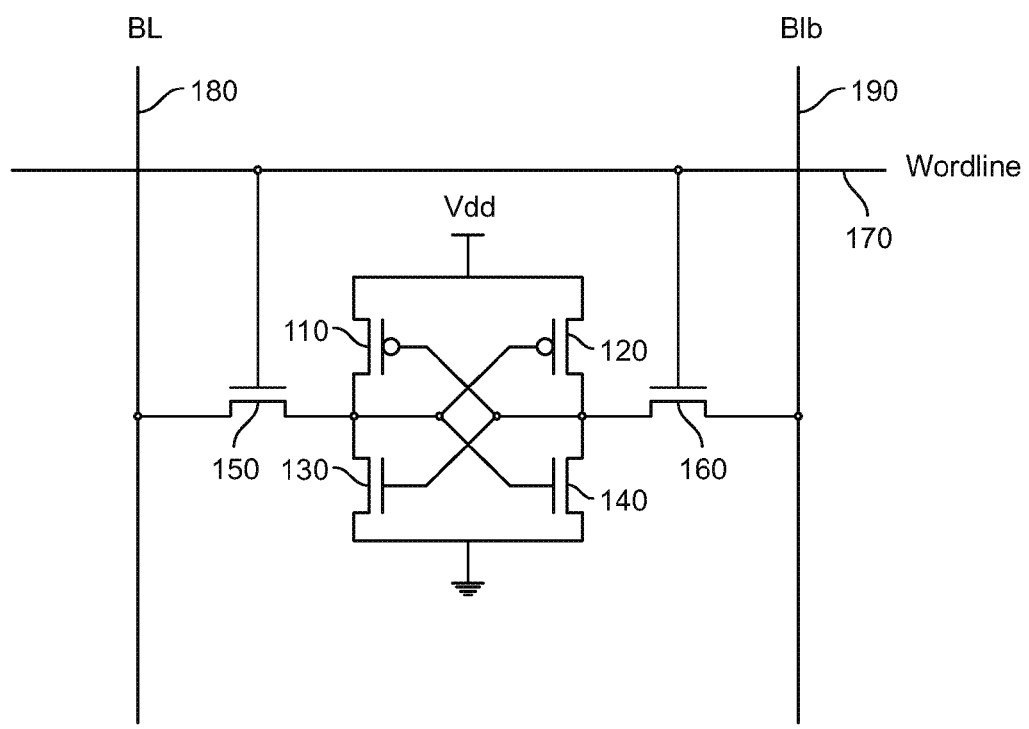
FIGS. 1A and 1B are diagrams of a 6-transistor (6T) memory cell and an 8-transistor (8T) memory cell, respectively, as may be used in embodiment(s) of the innovations herein.
Figure 1B:
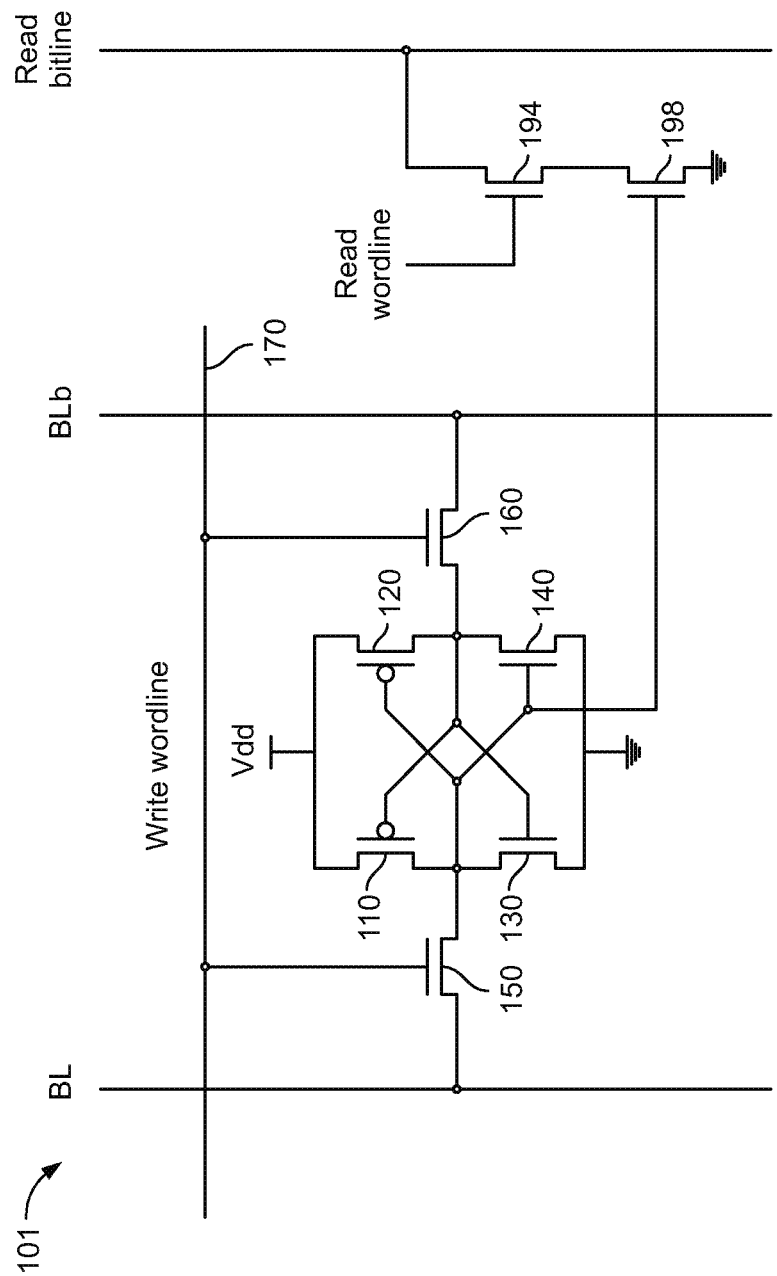

FIGS. 1A and 1B are diagrams of a 6-transistor (6T) memory cell and an 8-transistor (8T) memory cell, respectively, as may be used in embodiment(s) of the innovations herein. FIG. 1A is a diagram of a 6 transistor (6T) memory cell 100 that is an example of a memory cell that may be used in exemplary SRAMs herein. Other memory cells having different numbers of transistors, different configurations, and/or different components may be used, consistent with aspects of the present innovations. This example cell 100 may store a bit on four transistors 110, 120, 130, 140 that form two inverters. Access transistors 150, 160 may control access to the storage transistors 110, 120, 130, 140 during a read or write operation. A wordline 170 may control the access transistors 150, 160 and thereby connect the cell 100 to the bit line 180 and complement bit line 190. The bit lines 180, 190 may transfer data to and from the cell 100 during read and write operations. FIG. 1B is a diagram of an 8 transistor (8T) memory cell that is another example of a memory cell that may be used in exemplary SRAMs herein. The 8T memory cell 101 of FIG. 1B may comprise the 6 transistors of FIG. 1A, arranged in similar manner, as well as two additional transistors 194, 198 arranged in series between the read bit line and ground, wherein a gate of the first additional transistor 194 may be coupled to the read wordline and a gate of the second additional transistor 198 may be coupled to the storage transistor(s), e.g., to a gate of the fourth storage transistor 140.

Figure 1C:
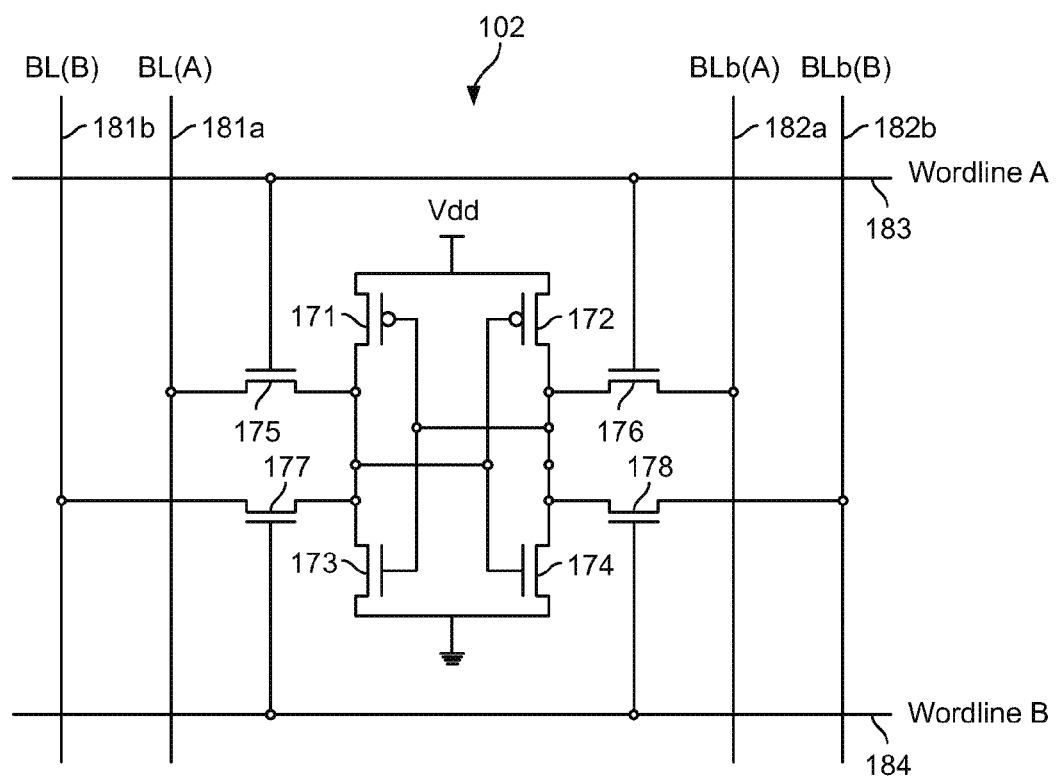
FIG. 1C is a diagram of a dual-port memory cell, as may be used in embodiment(s) of the innovations herein.

FIG. 1C is a diagram of a dual-port memory cell, as may be used in embodiment(s) of the innovations herein. This example cell 102 may store a bit on four transistors 171, 172, 173, 174 that form two inverters. Access transistors 175, 176, 177, 178 may control access to the storage transistors during a read or write operation. Wordline A 183 and wordline B 184 may control the access transistors and thereby connect the cell 102 to the bit lines, bit line A 181A and bit line B 181B, and to the complement bit lines, complement bit line A 182A and complement bit line B 182B. The bit lines, in turn, transfer data to and from the cell 102 during read and write operations.

Figure 2:
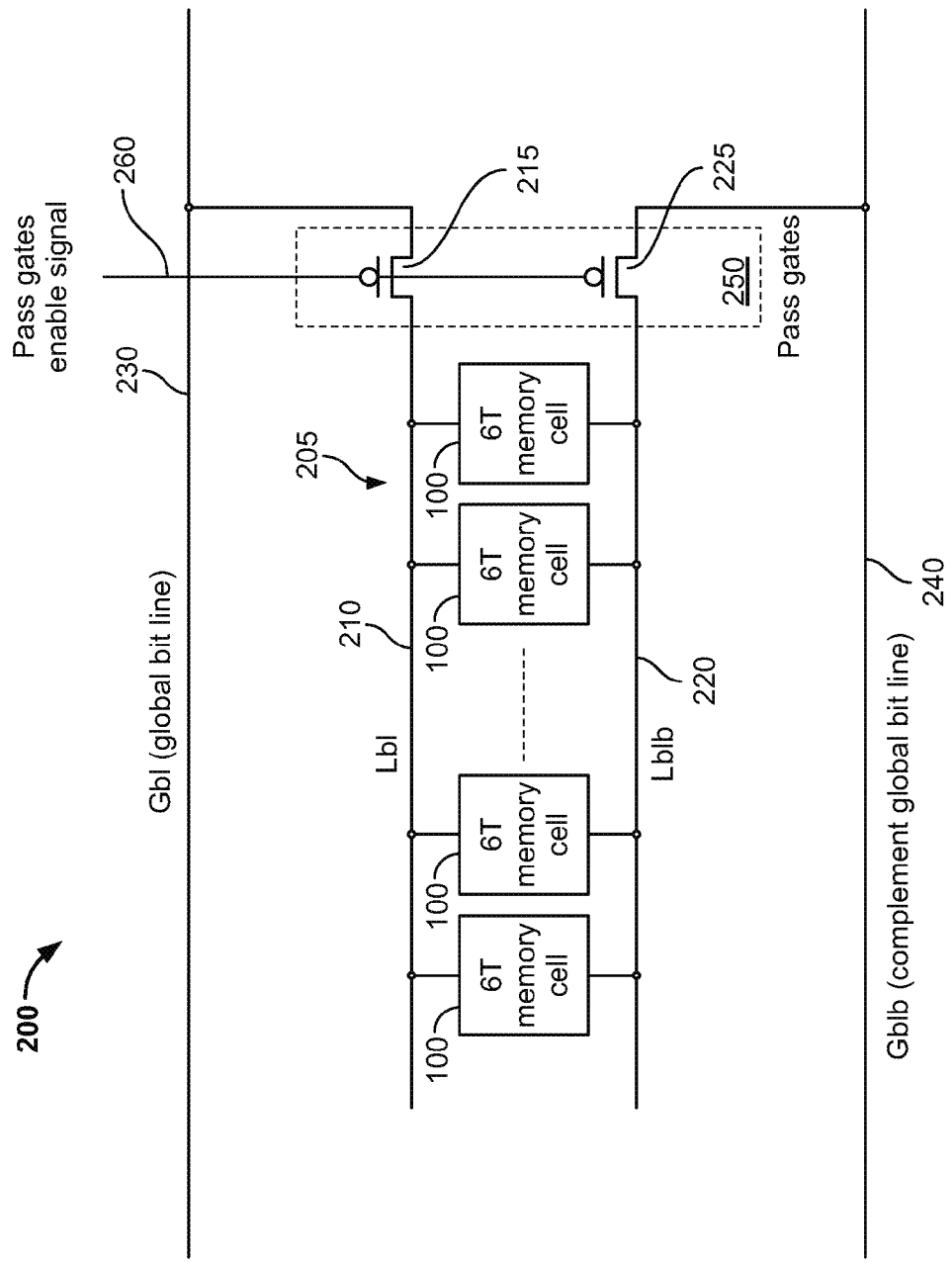
FIG. 2 is a diagram of an illustrative static random access memory (SRAM) including a sectioned bit line (SBL) and associated pass gates according to a disclosed implementation.

FIG. 2 is a diagram of a static random access memory (SRAM) 200 including a sectioned bit line (SBL) 205 according to an implementation of the innovations herein. Referring to FIG. 2, one or more memory cells 100 may connect to a LBL (local bit line) 210 and LBLb (complement local bit line) 220. In the example of FIG. 2, the memory cells are shown as 6T memory cells 100, though other memory cells may be utilized consistent with aspects of the innovations herein. Further, LBL 210 may connect to a pass gate transistor 215, and LBLb 220 may connect to a complement pass gate transistor 225. In some embodiments, the LBL 210 may connect to the drain of the pass gate transistor 215, and the LBLb 220 may connect to the drain of the complement pass gate transistor 225. The pass gate transistor 215 may connect to a GBL (global bit line) 230, and the complement pass gate transistor 225 may connect to a GBLb (complement global bit line) 240. A pass gate enable signal may control the pass gate transistor 215 and complement pass gate transistor 225 to allow communication between the LBL 210 and GBL 230 and between the LBLb 220 and GBLb 240 during read or write operations. In some embodiments, the true signal on the local bit lines 210, 220 may be passed to the global bit lines 230, 240, as opposed to a representation (such as an inverse) of the local bit line signal. In the illustrative implementation shown in FIG. 2, the pass gate enable line 260 controls the pair of pass gate transistors 250, coupling the local bit line to the global line when enabled. In operation, a desired memory cell 100 is selected and the enable signal 260 is enabled, to pass the desired read or write between the selected memory cell and the global bit line 230.

Moreover, in some implementations, the SBL 205 may be pre-charged to high before an operation, such as when the memory cells herein are configured in NMOS and utilize the memory cell design and characteristics of NMOS (e.g., electron mobility, etc.). In such implementations, the local bit line herein may be pre-charged to high to keep NMOS transistors in the active region. Accordingly, the present systems and methods may have one or more of the local bit lines be pre-charged to high to enable correspondingly improved operation of active NMOS transistors in the associated memory cell(s). Further, the present systems and methods may also be configured with bit lines pre-charged to high to enable such improved operation through the sense amplifier, e.g., in implementations that include NMOS voltage sense amplifiers.

Figure 3:
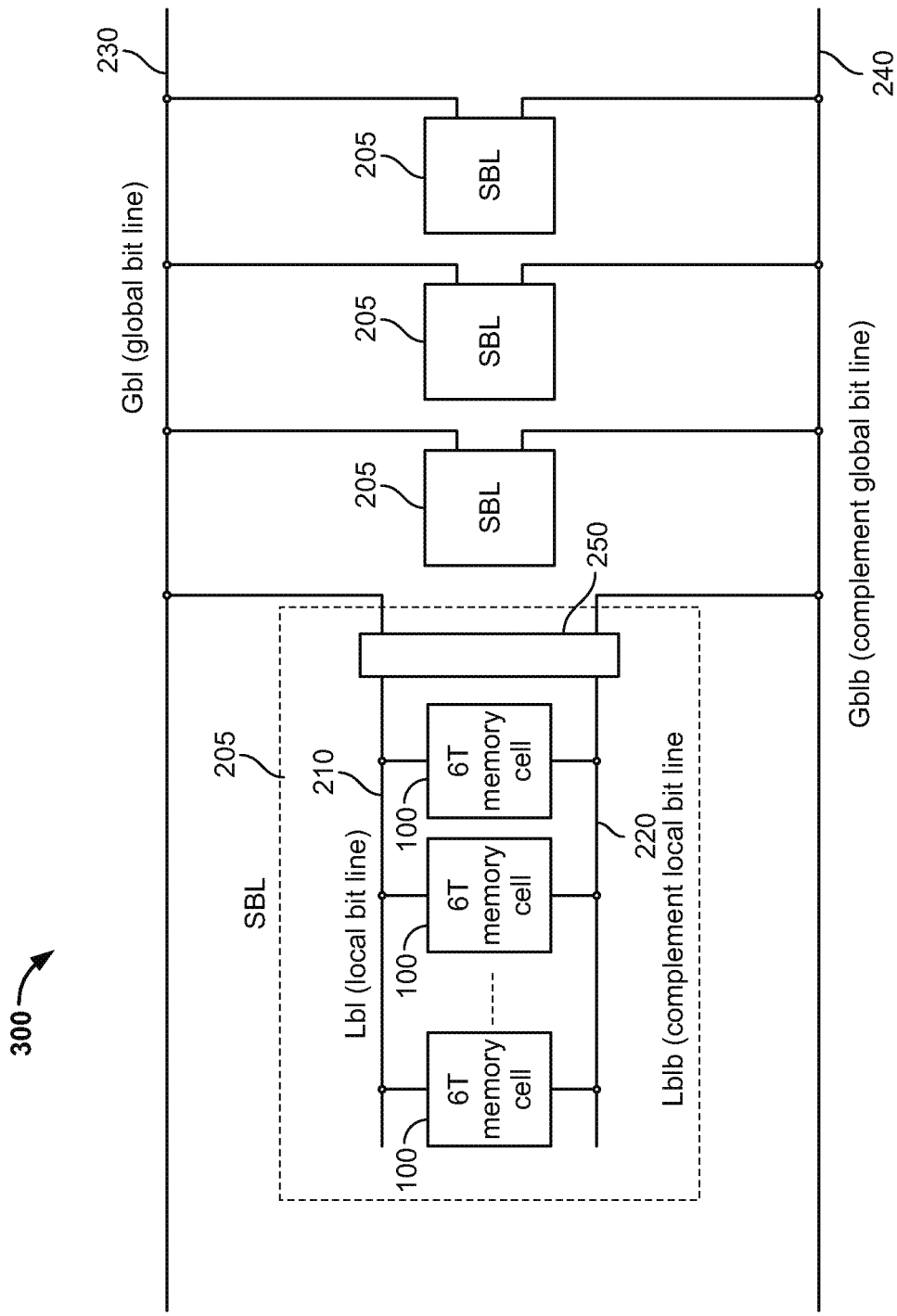
FIG. 3 is a diagram of an illustrative SRAM including a plurality of SBLs according to a disclosed implementation.

FIG. 3 is a diagram of an SRAM 300 including a plurality of SBLs 205 according to a disclosed implementation. In this example, four SBLs 205 are shown connected to a GBL 230 and GBLb 240, although other quantities of SBLs 205 may be provided in any given subset of SBLs. During operation, there may be only one SBL 205 connected to the GBL 230 and/or GBLb 240 at any time. As described in more detail below, such sectioned bit line architecture offers greater flexibility, reduced overall bit line capacitance, bit line length reduction as well as improved memory cell stability and power reduction.

Figure 4:
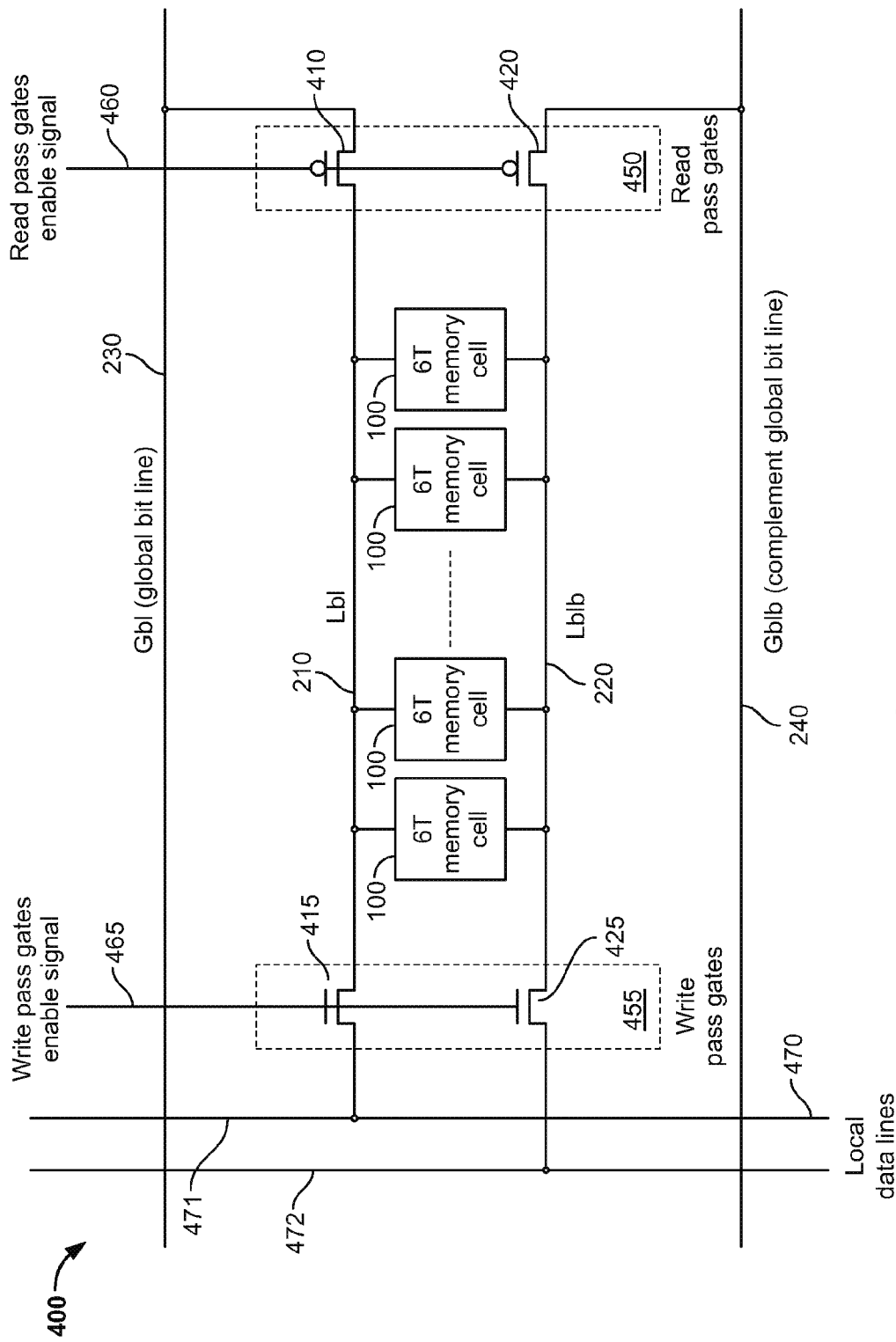
FIG. 4 is a diagram of an illustrative SRAM including an SBL and associated read and write pass gates according to a disclosed implementation.

FIG. 4 is a diagram of an SRAM 400 including an SBL 405 according to a disclosed implementation. Like the SBL 205 of FIG. 2, the SBL 405 of FIG. 4 may have a plurality of memory cells 100, an LBL 210, and an LBLb 220. In this embodiment, separate read pass gate circuitry 450 and write pass gate circuitry 455 are provided. Here, for example, illustrative read pass gate circuitry 450 may comprise two transistors 410, 420, such as PMOS transistors, with drains coupled to their respective local bit lines. Illustrative write pass gate circuitry 455 may comprise two transistors 415, 425, such as NMOS transistors, with drains similarly coupled to their respective local bit lines. Further, in some implementations, such separate read pass gate circuitry 450 and write pass gate circuitry 455 may speed up cycle time, such as when a write operation follows a read operation. LBL 210 may connect to a read pass gate transistor 410 and write pass gate transistor 415, and LBLb 220 may connect to a complement read pass gate transistor 420 and complement write pass gate transistor 425.

The read pass gate transistor 410 may connect to a GBL 230, and the complement read pass gate transistor 420 may connect to a GBLb 240. Read pass gate enable signals may control the read pass gate transistor 410 and the complement read pass gate transistor 420 to allow communication between the LBL 210 and GBL 230 and between the LBLb 220 and GBLb 240 during read operations. In this example, a single read pass gate enable signal 460 controls the pair of read pass gate transistors 450 with the same command. In this example, the read pass gate transistors 450 are PMOS devices, although other types of transistors may be used. For example, other implementations of read and write pass gate configurations consistent with the innovations herein include configurations where NMOS transistors are utilized for both read and write pass gates, configurations where PMOS transistors are utilized for both read and write pass gates, as well as configurations where both NMOS and PMOS transistors are utilized together for both read and write pass gates.

In this embodiment, local data lines 470 may also be provided. The write pass gate transistor 415 may connect to a first local data line 471, and the complement write pass gate transistor 425 may connect to a second local data line 472. In other embodiments, the read pass gate transistors 450 may connect to the local data lines 470, and the write pass gate transistors 455 may connect to the GBL 230 and GBLb 240. Write pass gate enable signals may control the write pass gate transistor 415 and the complement write pass gate transistor 425 to allow communication between the LBL 210 and first local data line 471 and between the LBLb 220 and second local data line 472 during write operations. In this example, a single write pass gate enable signal 465 controls the pair of write pass gate transistors 455 with the same command. In the illustrated implementation, the write pass gate transistors 455 may be NMOS devices, although other types of transistors may be used.

Figure 5:
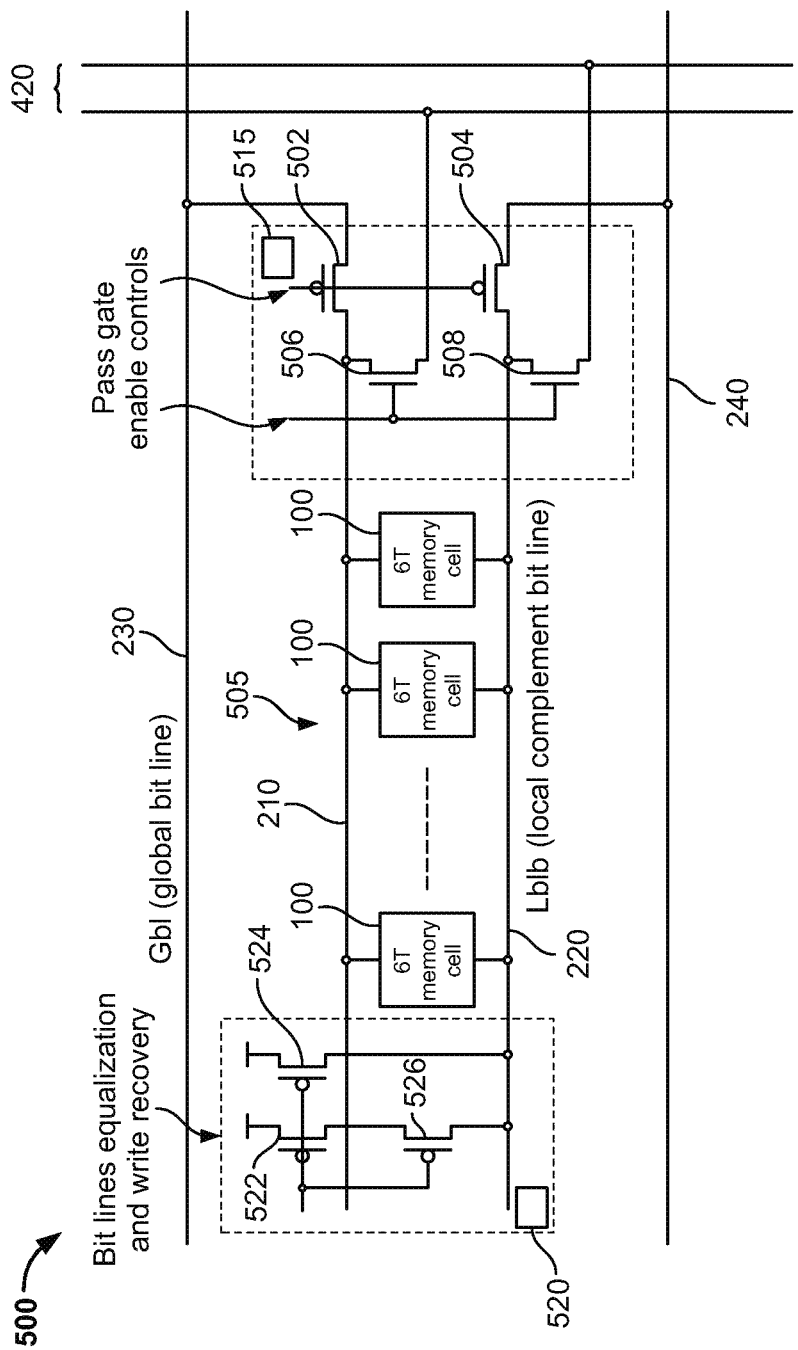
FIG. 5 is a diagram of an illustrative SRAM including an SBL with illustrative pass gate circuitry as well as illustrative equalization and/or write recovery circuitry according to a disclosed implementation.

FIG. 5 is a diagram of an exemplary SRAM including an SBL with illustrative pass gate circuitry as well as illustrative equalization and/or write recovery circuitry according to a disclosed implementation. The SRAM of FIG. 5 may include various pass gate (read and/or write) circuitry as set forth elsewhere herein. The pass gate circuitry illustrated in FIG. 5 has separate read and write enable controls, as discussed above, and has comparable bit line connections, as shown here in the context of a complementary pass gate cell 515 containing the various read/write pass gate transistors that couple the read/write pass gate enable signals to the local bit line and complement local bit line, respectively. In one illustrative implementation, a complementary pass gate cell 515 may comprise read pass gate circuitry including a first PMOS transistor 502 that couples the local bit line 210 to the global bit line 230 and a second PMOS transistor 504 that couples the complement local bit line 220 to the complement global bit line 240. Further, such complementary pass gate cell 515 may further comprise a first NMOS transistor 506 that couples the local bit line 210 to the local data line(s) 420 and a second NMOS transistor 508 that couples the complement local bit line 220 to the local data line(s) 420. Moreover, all of these coupling transistors 502, 504, 506, 508 may be configured such that the actual signals on the local lines are directly coupled to the associated global bit lines or local data lines via their source-to-drain connections, i.e., their actual, not complementary values, are provided as outputs. Referring to FIG. 5, equalization and/or write recovery circuitry 520 is also shown, consistent with aspects of the innovations herein. This circuitry 520 may be configured as bit line equalization circuitry, as write recovery circuitry, or as both. In the illustrated implementation, such circuitry 520 includes a first transistor 522 with drain coupled to the local bit line, a second transistor 524 with drain coupled to the local complement bit line, and a third transistor 526 with source coupled to the local bit line and drain coupled to the local complement bit line, wherein gates of the first, the second and the third transistors are coupled together to an equalization enable signal. Further, in some implementations, the first transistor 522, the second transistor 524, and the third transistor 526 may be PMOS transistors.

Here, as a function of such configurations, local bit line equalization may be achieved by way of equalizing the global bit line as long as the read pass gate of the SBL is on. Further, an advantage of such systems and methods is that chip surface area is reduced by removing the need for local equalization components. But, in some operations/implementations, other issues may exist, such as longer cycle time because the equalization cannot begin until after the sensing of the bit line is completed. In implementations herein, however, by including the bit line equalization into sectioned bit line, the bit line equalization may start earlier by shutting off read pass gate(s) without affecting unfinished sensing on the global bit line. Further, since the sectioned bit line is short, the associated local equalization response is correspondingly small. Accordingly, the area penalty is also small for such implementations, though the advantages of reducing cycle time/operation are more than enough to justify the extra area.

Figure 6:
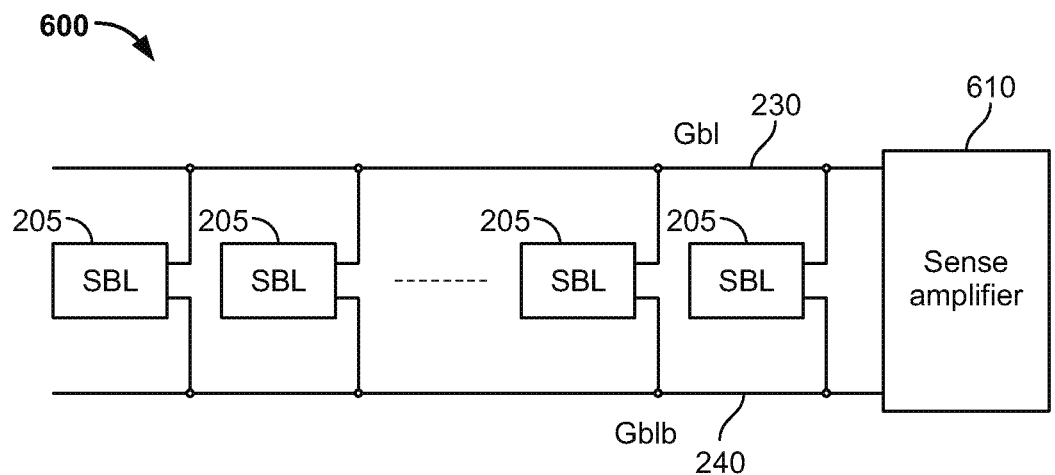
FIG. 6 is a diagram of an illustrative SRAM including a plurality of SBLs configured in a single row in the bit line direction with a sense amplifier according to a disclosed implementation.

FIG. 6 is a diagram of an SRAM 600 including a plurality of SBLs 205 configured in a row with a sense amplifier according to a disclosed implementation. In the illustrated implementation, the SRAM 600 has a configuration similar to the SRAM 300 of FIG. 3, but with a sense amplifier 610 shown. The sense amplifier 610 may detect and amplify signals on the GBL 230 and GBLb 240, for passing along to the circuitry accessing the SRAM. The plurality of SBLs 205 may be arranged in a single row in the bit line direction to form the GBL 230 and GBLb 240.

Figure 7:
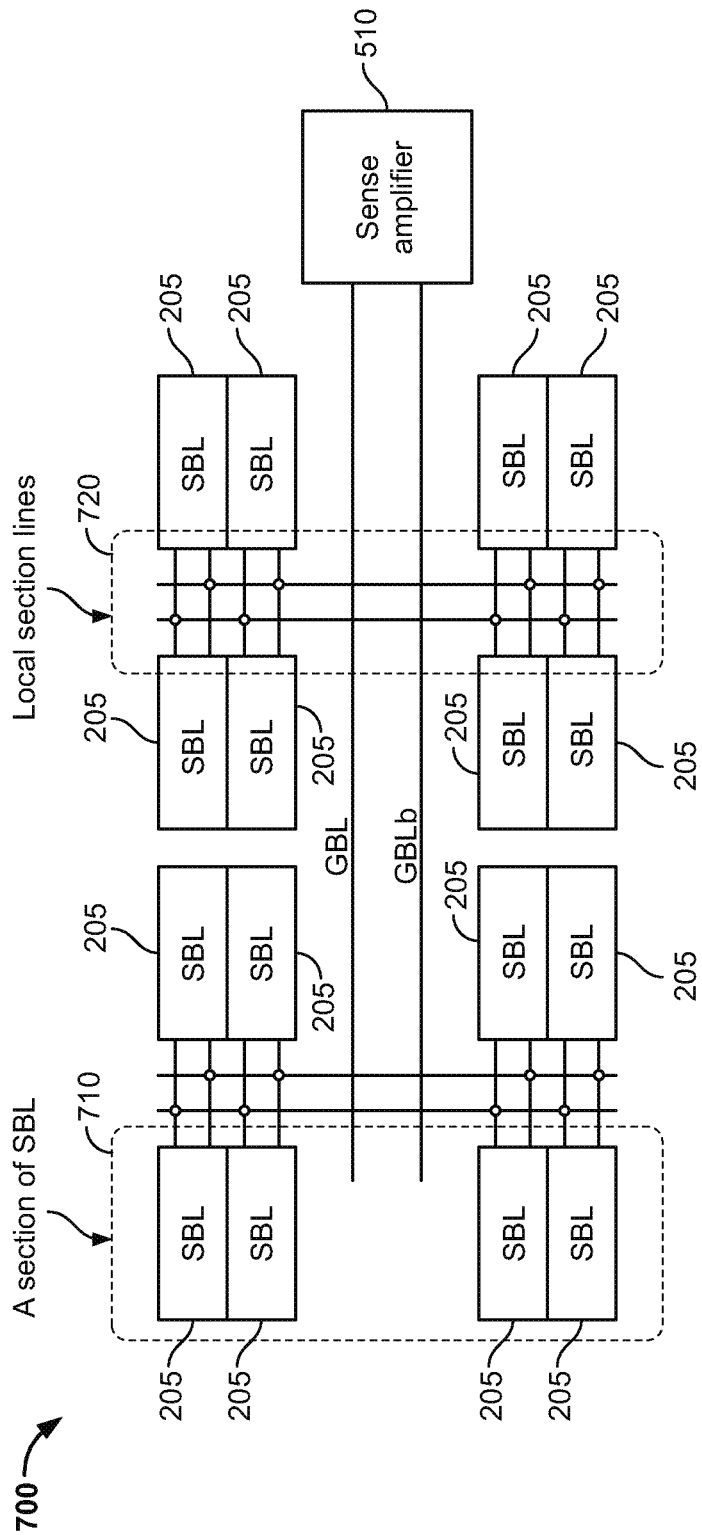
FIG. 7 is a diagram of an illustrative SRAM including a plurality of SBLs arranged in a matrix according to a disclosed implementation.

Bit line length in such SRAM circuits (i.e., overall or effective bit line length) may be given, approximately, as the sum of the SBL length and the GBL length. In order to reduce overall bit line length, implementations herein include SBLs arranged into matrices of multiple columns and rows that optimize the global bit line length. FIG. 7 is a diagram of an SRAM 700 including a plurality of SBLs 205 according to one such illustrative implementation of the innovations herein. Referring to FIG. 7, SBLs 205 may be arranged into a matrix of multiple columns and rows, which may reduce the overall bit line length otherwise present. In the example SRAM 700 of FIG. 7, the SRAM section shown is arranged into four columns of SBLs, although different arrangements are possible. Each of the columns may be regarded as a section 710. Thus, as used herein, connections between sections 710 and the global bit lines 230, 240 may be provided via local section lines 720.

FIG. 7 illustrates that global bit line may be shortened by implementing such plural SBLs arranged in multiple rows and columns to reduce global bit line length at the same time maintaining the memory array density. Further, such configurations entail additional column decoding required to achieve SBL matrix. Since there are many SBLs that are directly connected to the GBL, so there should be only one SBL that can be connected to the GBL at any time.

Further, consistent such configurations and the considerations and innovations set forth herein, the present implementations may comprise multiple bit lines sharing a sense amplifier with multiple SRAM cells selected. Further, such selected SRAM cells may be connected to both true and complement bit lines. In some such embodiments, the pass gates on true and complement local bit lines may be configured for selection at the same time. In other implementations, a word line may select multiple memory cells on multiple bit line pairs. Moreover, bit lines in various implementations herein may be charged to full Vcc of the SRAM.

Moreover, from a fabrication standpoint, SRAMs consistent with the innovations herein may be configured such that the global bit lines and/or control signals are formed in layers above or below the memory cells, i.e., on higher/lower level(s). See, for example, FIGS. 15A-15D. Such configurations provide better tracking in relation to the associated control signal(s), especially as against sense amplifier enable signal(s) and the SBL selection signals for SRAMs.

Figure 8:
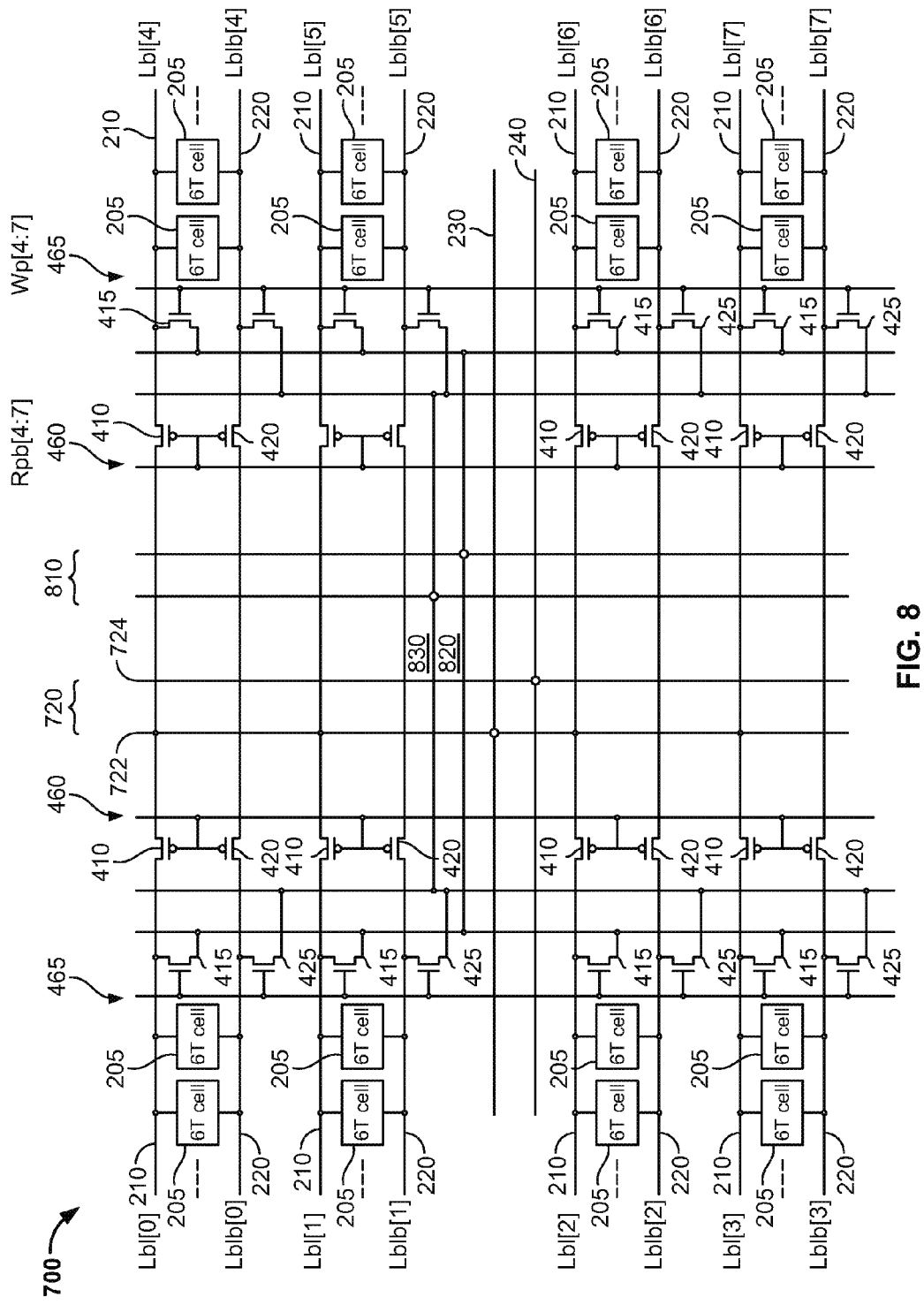
FIG. 8 is a diagram showing local connections of an illustrative matrix of a plurality of SBLs, such as that of FIG. 7, associated with exemplary SRAM memory according to a disclosed implementation.

FIG. 8 is a diagram of local connections of a plurality of SBLs 205 in an SRAM 800 according to an embodiment of the invention. FIG. 8 shows the local connections of the embodiment of FIG. 7 in greater detail. The SRAM may comprise a plurality of SBLs 205 which may be linked to LBLs 210 and LBLbs 220. In the illustrative implementation shown here, eight pairs of LBLs 210 and LBLbs 220 are provided. Each LBL 210 may have at least one associated read pass gate 410 and write pass gate 415, and each LBLb 220 may have at least one associated read pass gate 420 and write pass gate 425. As described above, the read pass gates 410, 420 may be controlled by read pass gate enable signals 460, and the write pass gates 415, 425 may be controlled by write pass gate enable signals 465.

As shown in FIG. 8, local section lines 720 may include LSL 722, LSLb 724, LDL 820, and LDLb 830. In this embodiment, LSL 722 and LSLb 724 may be used for write operations and may not be connected to the GBL 230 and GBLb 240. If they are not connected to the GBL 230 and GBLb 240, the LSL 722 and LSLb 724 do not directly contribute any loading to the GBL 230 and GBLb 240. Further, in some certain implementations, the LDL 820 and LDLb 830 may even be used for read operations. The pass gates 410, 415, 420, 425 associated with the SBLs 205 may be drawn in the bit line pitch of the SRAM 700 so multiple SBLs 205 may be arranged side by side.

Referring to FIG. 8, the local section lines 720 may be shorter and less capacitive than that of SBL since the length of Lsl and Lslb is only that of few memory cells. In one illustrative implementation, for example, systems may be configured with 8 SBLs connected to the Lsl and Lslb (see, e.g., FIG. 8), wherein the length of Lsl or Lslb is only about 4 bit line pitch width, which is very insignificant as compared to the length of local sectioned bit line or global bit line length.

Figure 10:
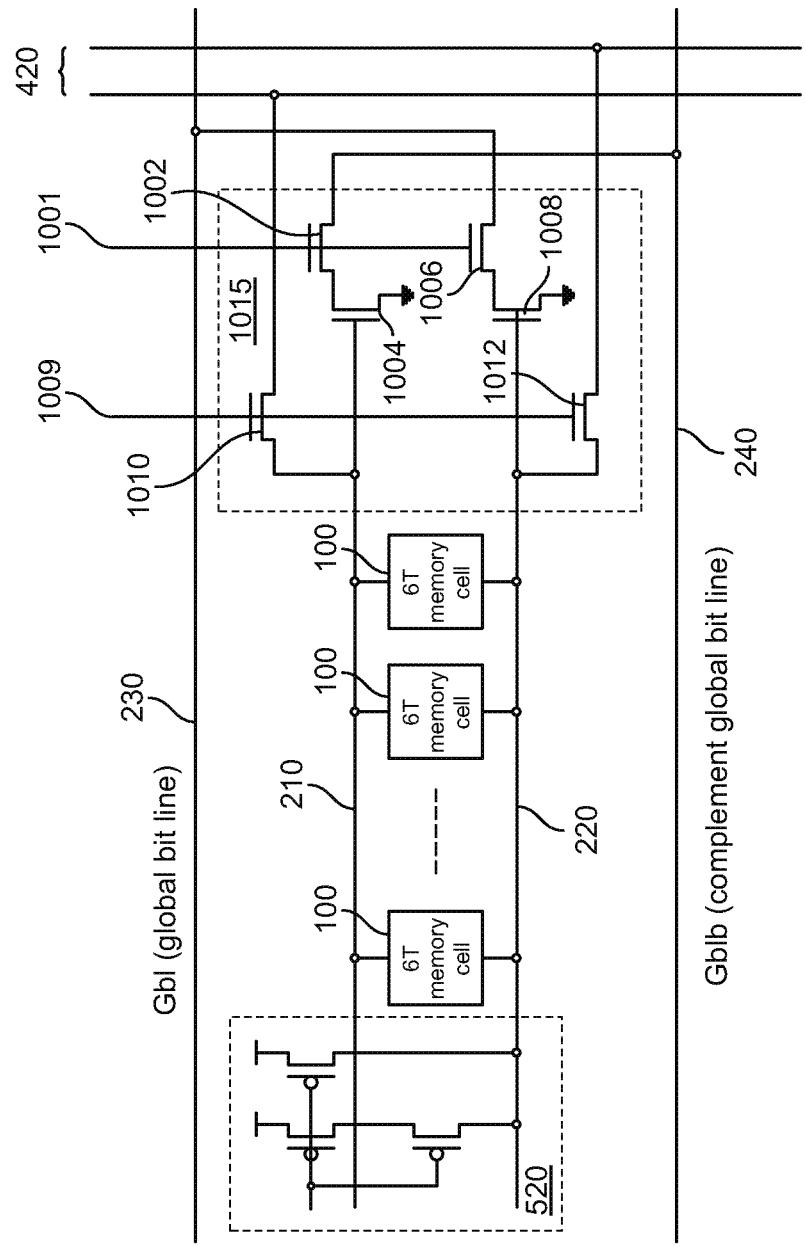
FIG. 10 is a diagram of an illustrative SRAM including an SBL with illustrative pass gate circuitry as well as illustrative equalization and/or write recovery circuitry according to a disclosed implementation.

With regard to implementations such as those shown in FIGS. 7 and 8, some simplified illustrations of sectioned bit line of FIG. 7 are shown in FIGS. 5 and 10, as explained in more detail above and below.

Figure 9A:
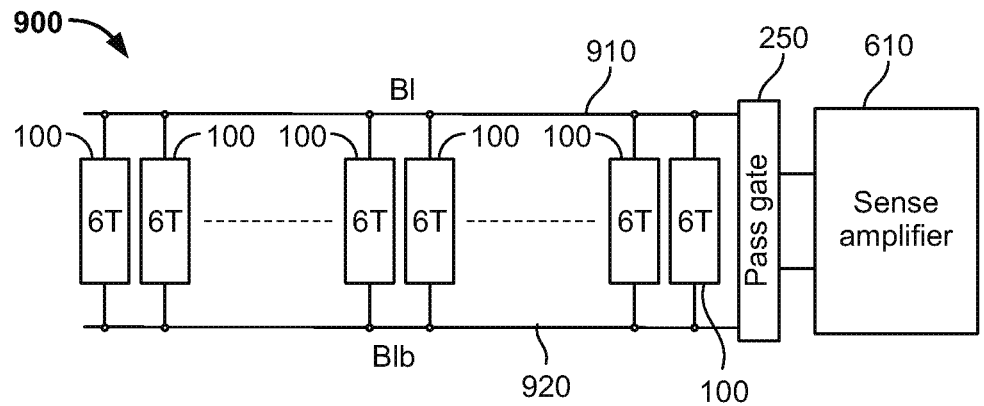
FIG. 9A is a diagram of an SRAM without SBLs.
Figure 9B:
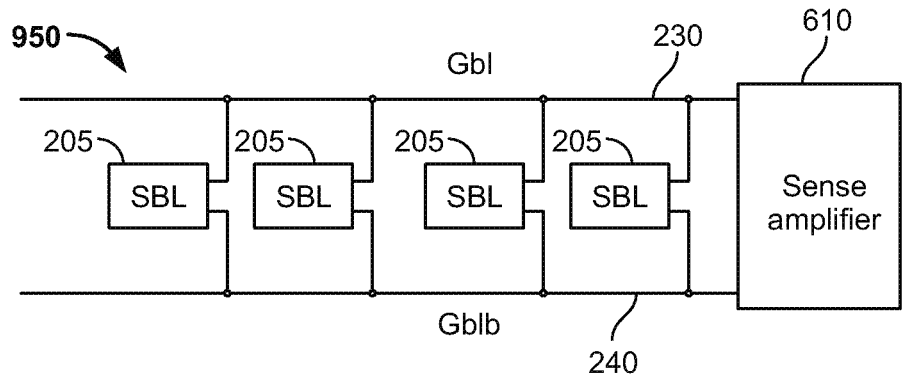
FIG. 9B is a diagram of an illustrative SRAM including a plurality of SBLs according to a disclosed implementation.
Figure 9C:
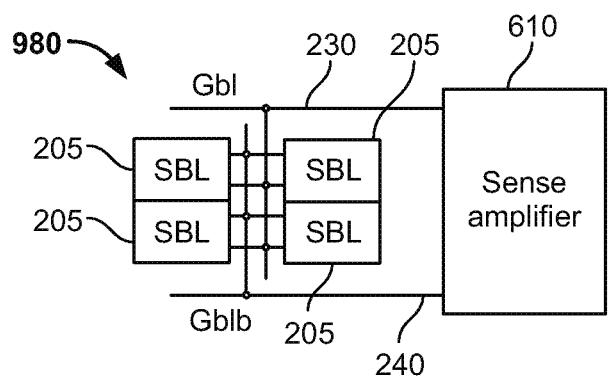
FIG. 9C is a diagram of an illustrative SRAM including a plurality of SBLs according to a disclosed implementation.

FIGS. 9A-9C show an exemplary comparison of a conventional SRAM bit line scheme (FIG. 9A) with two SBL configurations (FIGS. 9B-9C). A conventional SRAM 900 with a plurality of memory cells 100 and bit lines 900, 910 is shown in FIG. 9A. For example, the SRAM 900 may have N memory cells 100. FIG. 9B is a diagram of an SRAM 950 including a plurality of SBLs 205 according to an embodiment of the invention. The SRAM 950 may also have N memory cells 100, but the memory cells 100 may be arranged within four SBLs 205, in this example. The memory cells 100 may be divided among other numbers of SBLs 205 in other embodiments. Global bit line length for the SRAM 900 without local bit lines and the SRAM 950 comprising local bit lines may be similar. However, the total junction capacitance of the SRAM 950 comprising local bit lines and four SBLs 205 may be approximately one quarter of the junction capacitance of the SRAM 900 without local bit lines. The global bit line length and capacitance may be further reduced by arranging the four SBLs 205 into two rows and two columns, as shown by the SRAM 980 of FIG. 9C. The global bit line length of SRAM 980 may be approximately half that of SRAM 950, and the global bit line length of SRAM 980 may be approximately the same as that of an SBL 205. The sectioned bit line architecture may offer many ways to arrange components to affect speed and power consumption.

FIG. 10 is a diagram of an illustrative SRAM including an SBL with illustrative pass gate circuitry as well as illustrative equalization and/or write recovery circuitry according to a disclosed implementation. Referring to FIG. 10, exemplary SRAM circuitry is disclosed, which may include pass gate circuitry having separate read and write enable controls, as discussed above, and may have comparable bit line connections. Further, various pass gate (read and/or write) or other circuitry may be included, as set forth elsewhere herein. For example, the SRAM circuitry may include equalization and/or write recovery circuitry 520, such as in FIG. 5, consistent with aspects of the innovations herein. This circuitry 520 may be configured as bit line equalization circuitry, as write recovery circuitry, or as both. In the illustrated implementation, such circuitry 520 may includes a first transistor with drain coupled to the local bit line, a second transistor with drain coupled to the local complement bit line, and a third transistor with source coupled to the local bit line and drain coupled to the local complement bit line, wherein gates of the first, the second and the third transistors are coupled together to an equalization enable signal. Further, in some implementations, these transistors may be PMOS transistors. Moreover, with regard to the pass gate circuitry, FIG. 10 illustrates another exemplary implementation of a complementary pass gate cell 1015 containing the various read/write pass gate transistors that couple the read/write pass gate enable signals to the local bit line and complement local bit line, respectively.

In one illustrative implementation, such complementary pass gate cell 1015 may comprise read pass gate circuitry including transistor pairs between the local bit lines and the global bit lines, such pairs including first transistors 1004, 1008 with gates connected to the local bit line and complement local bit line, respectively, and sources coupled to drains of second transistors 1002, 1006 that have gates coupled to the read pass enable signal and sources connected to the complement global bit line 240 and global bit line 230, respectively. Further, such complementary pass gate cell 1015 may further comprise a first NMOS transistor 1010 that couples the local bit line 210 to the local data line(s) 420 and a second NMOS transistor 1012 that couples the complement local bit line 220 to the local data line(s) 420. Moreover, these coupling transistors or these combinations of coupling transistors may be configured such that the actual signals on the local lines are directly coupled to the associated global bit lines or local data lines via their source-to-drain connections, i.e., their actual, not complementary, values are provided as outputs.

Further, e.g. in implementations such as that of FIG. 8, multiple level column decoding may be utilized to provide proper connection to the GBL, which may be configured in the same direction as local bit lines. Additionally, as shown by way of one illustration in FIG. 18, the local sense amplifier enable signal and/or the local data driver enable signal, with regard to the memory cells layout, may also be configured in the same direction as local bit line. Indeed, in some implementations, the local sense amplifier enable and local data driver enable are part of Y (column) decoding of the global bit line. Moreover, such SRAMs and associated method herein may be implemented such that the local select (LS) is a function of X decoding. Further, in some implementations, local select (LS) and local pass gate enable signals (Rpb and Wp) may be configured in the word line direction.

Figure 11:
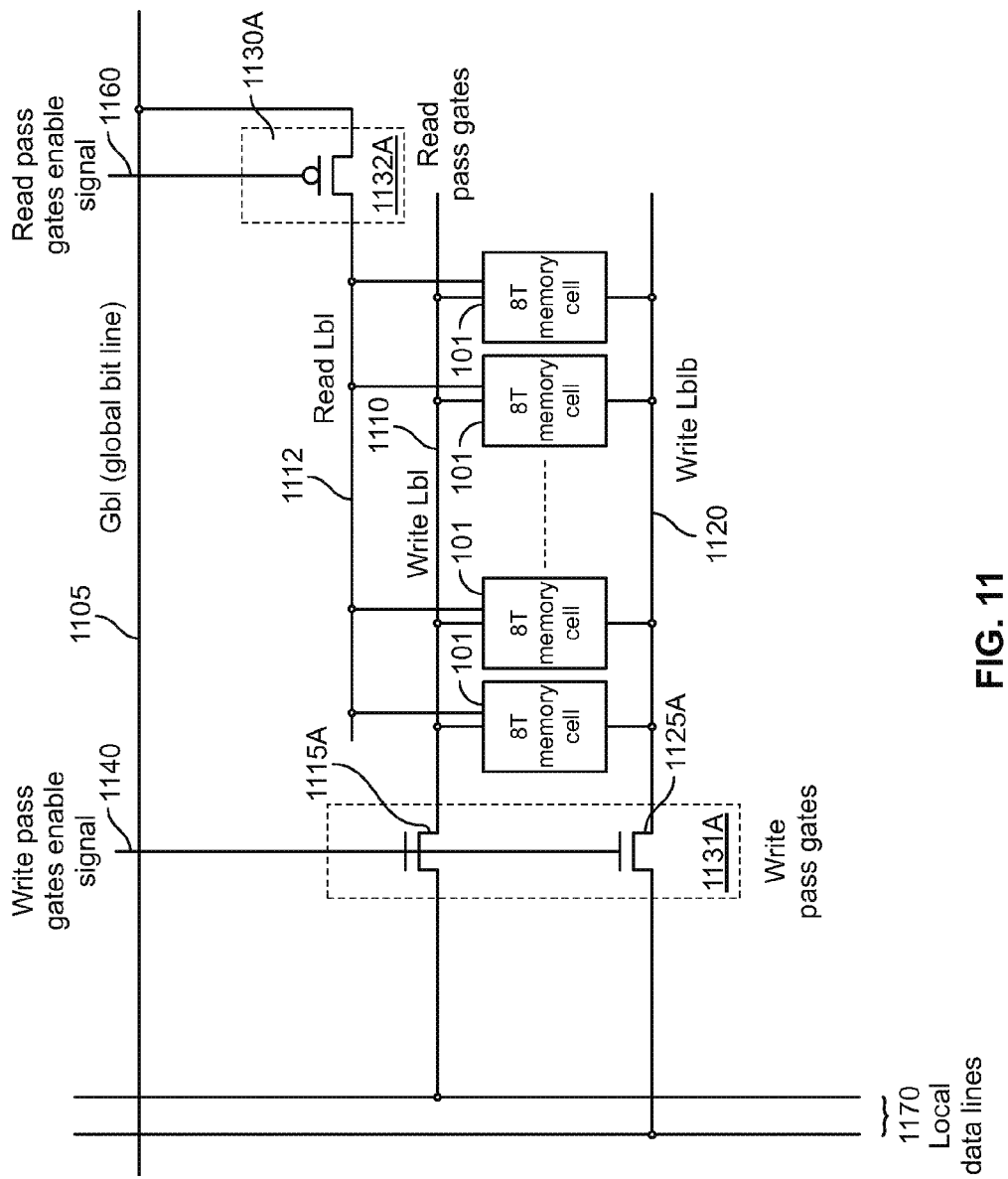
FIGS. 11 and 12 are diagrams of illustrative SRAMs including SBLs, 8T memory cells and associated read and write pass gates according to disclosed implementations.
Figure 12:
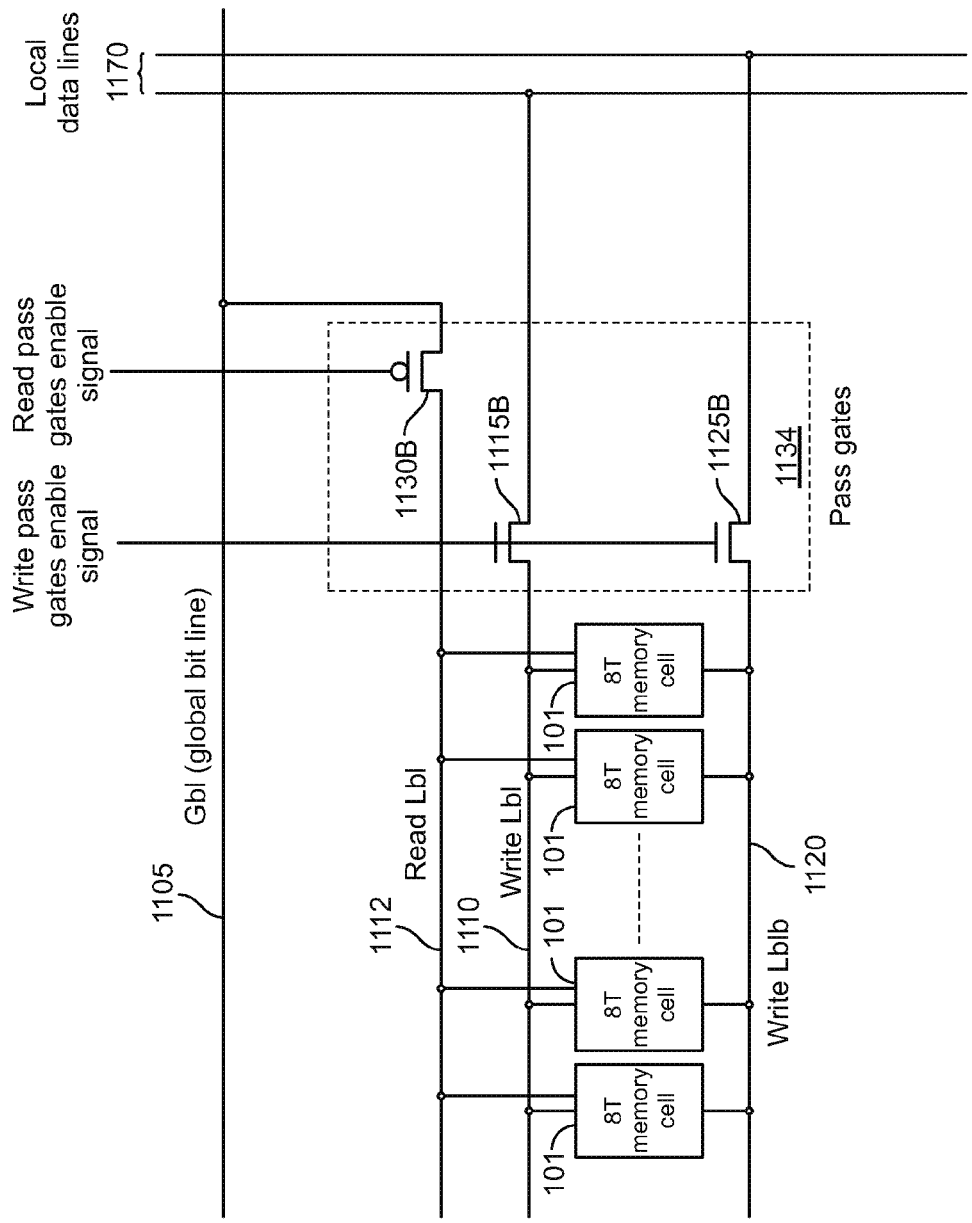

FIGS. 11 and 12 are diagrams of illustrative SRAMs including SBLs, 8T memory cells and associated read and write pass gates according to disclosed implementations. As with the previous implementations, the SBLs of FIGS. 11 and 12 may have a plurality of 8T memory cells 101, local data lines 1170, as well as local and global bit lines. The implementations of FIGS. 11 and 12 include a write local bit line 1110, a read local bit line 1112 and a complement write local bit line 1120. In the embodiment of FIG. 11, separate read pass gate circuitry 1132A and write pass gate circuitry 1131A are provided. Here, for example, illustrative write pass gate circuitry 1131A may comprise two transistors 1115A, 1125A, such as NMOS transistors, with drains coupled to their respective local bit lines, write local bit line 1110 and complement write local bit line 1120. Illustrative read pass gate circuitry 1132A may comprise a transistor 1130A, such as PMOS transistor, with drain coupled to its respective read local bit line 1112. Again, in some implementations, such separate read pass gate circuitry and write pass gate circuitry may speed up cycle time, such as when a write operation follows a read operation.

Referring to FIG. 11, the read pass gate transistor 1130A may connect to a GBL 1105. Further, a read pass gate enable signal 1160 may control the read pass gate transistor(s) to allow communication between the local and global bit lines during read operations. In this example, the read pass gate transistor 1130A may be a PMOS device, although other types of transistors may be used.

In this embodiment, local data lines 1170 may also be provided. A first write pass gate transistor 1115A may connect to a first local data line, and the complement write pass gate transistor 1125A may connect to a second local data line. In this example, a single write pass gate enable signal 1140 may control the pair of write pass gate transistors with the same command. In the illustrated implementation, the write pass gate transistors 1115A, 1125A may be NMOS devices, although other types of transistors may be used.

In the embodiment of FIG. 12, an integrated and/or "complementary" pass gate circuit 1134 may be provided. Here, for example, the read/write transistors and control functionality set forth above may be integrated into a structurally, functionally and/or electrically unitary module or component. In particular, control and signals provided to such integrated circuitry may be configured as complementary circuitry to provide greater efficiency, decreased size, reduction in cost, or the like.

Overall, the decision of which such pass gate structures to use may be a determination performed as a function of structural and/or layout considerations, such as issues of separation of the read bit line from the write bit line, need for better memory cell stabilization, higher speed, and/or lower power, among other desires.

Figure 13:
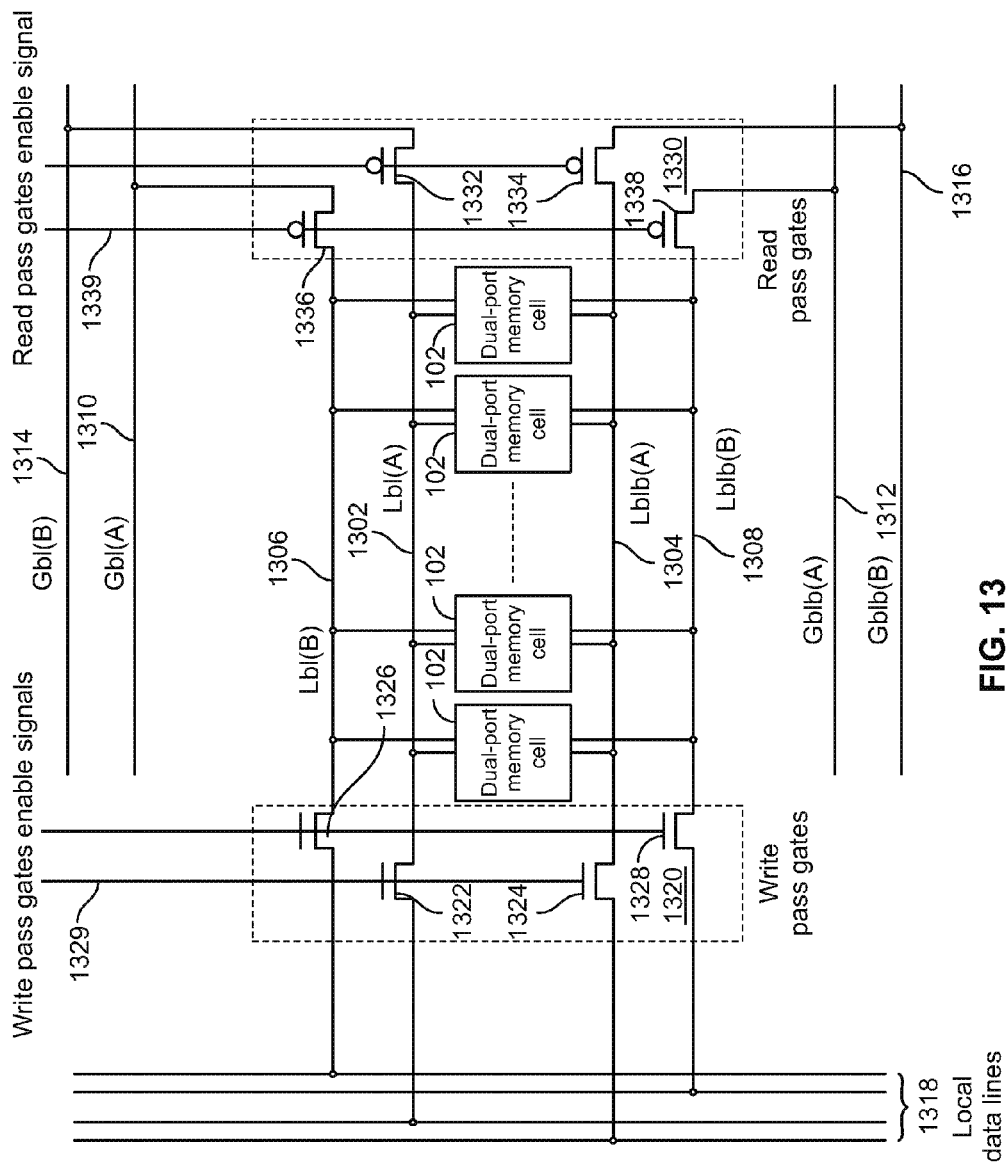
FIGS. 13 and 14 are diagrams of illustrative SRAMs including SBLs, dual-port memory cells and associated read and write pass gates according to disclosed implementations.
Figure 14:
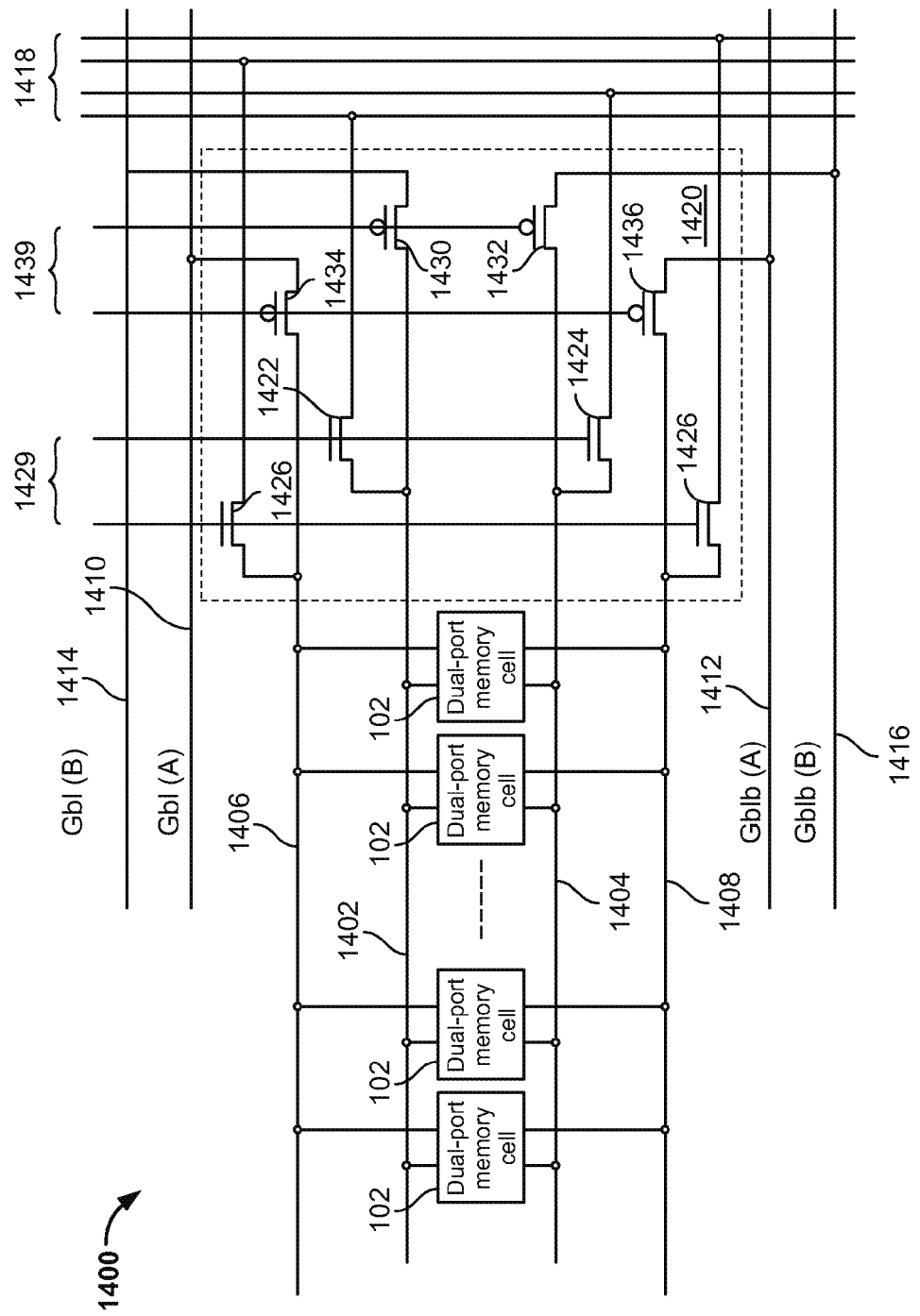
Figure 15A:
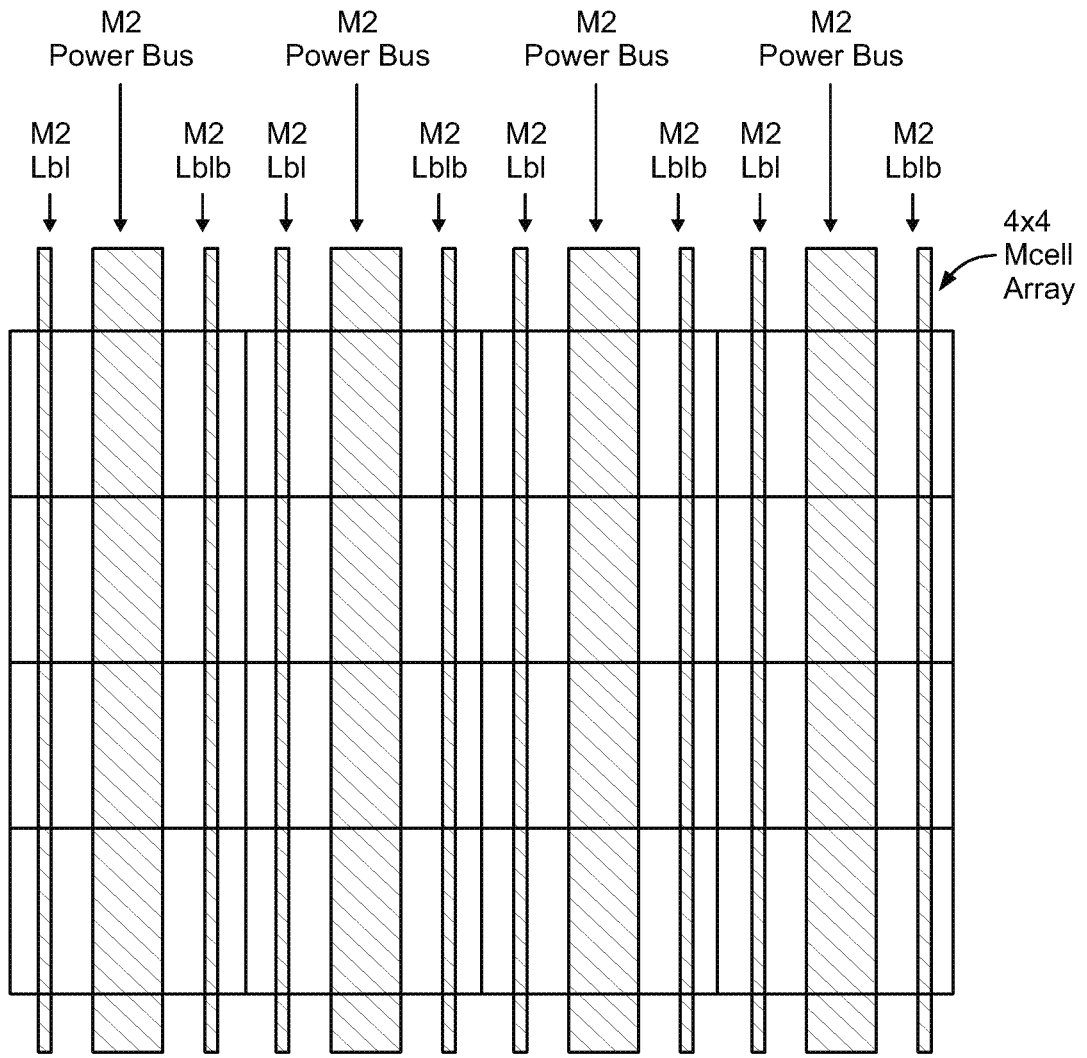
FIGS. 15A-15D are diagrams of illustrative SRAM cells including detail of exemplary layering of the SRAM structures according to disclosed implementations.
Figure 15A:
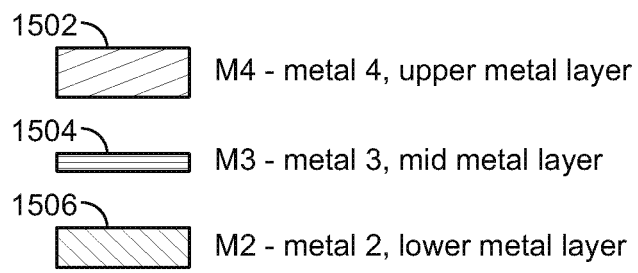
Figure 15B:
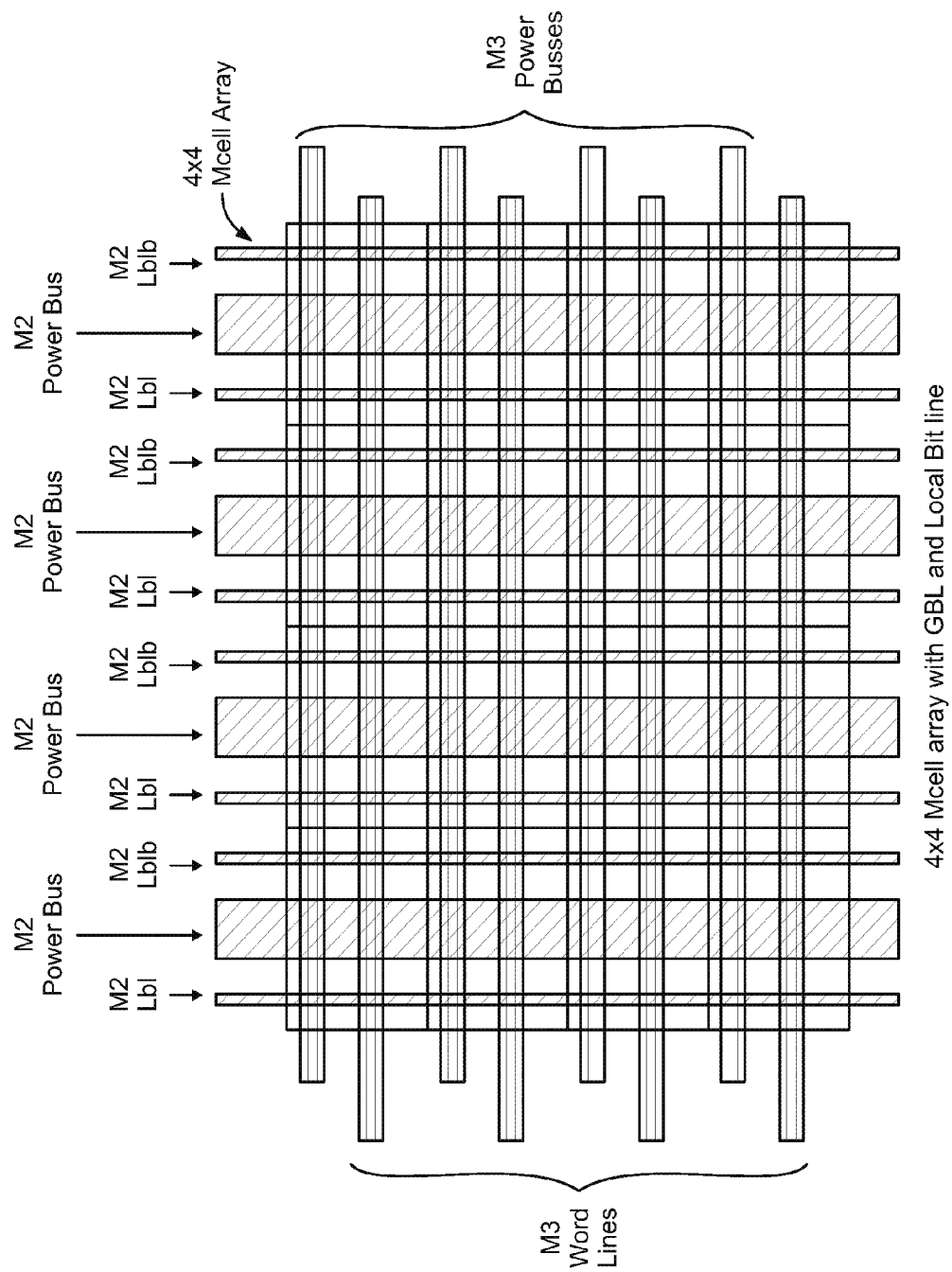
Figure 15C:
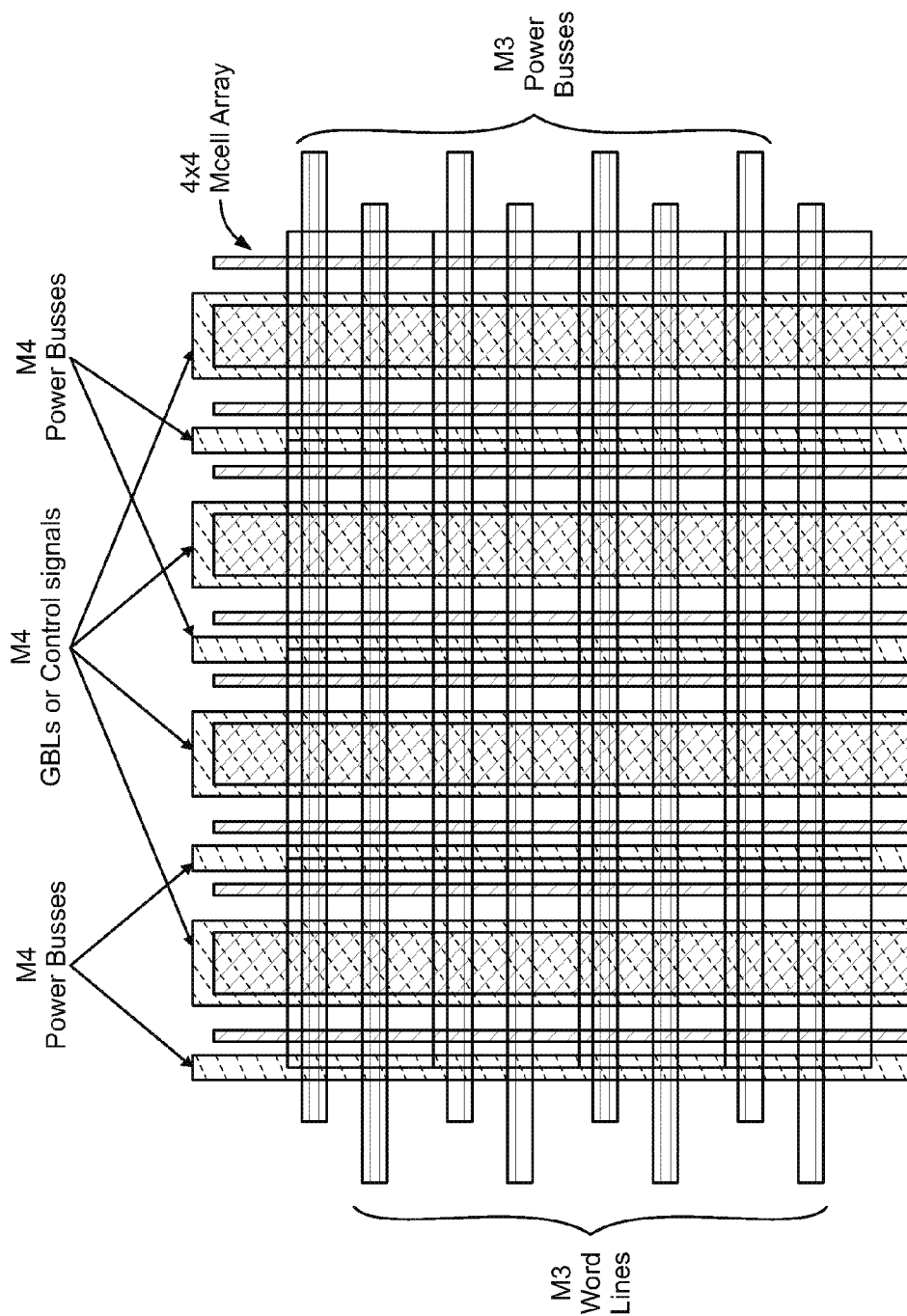
Figure 15D:
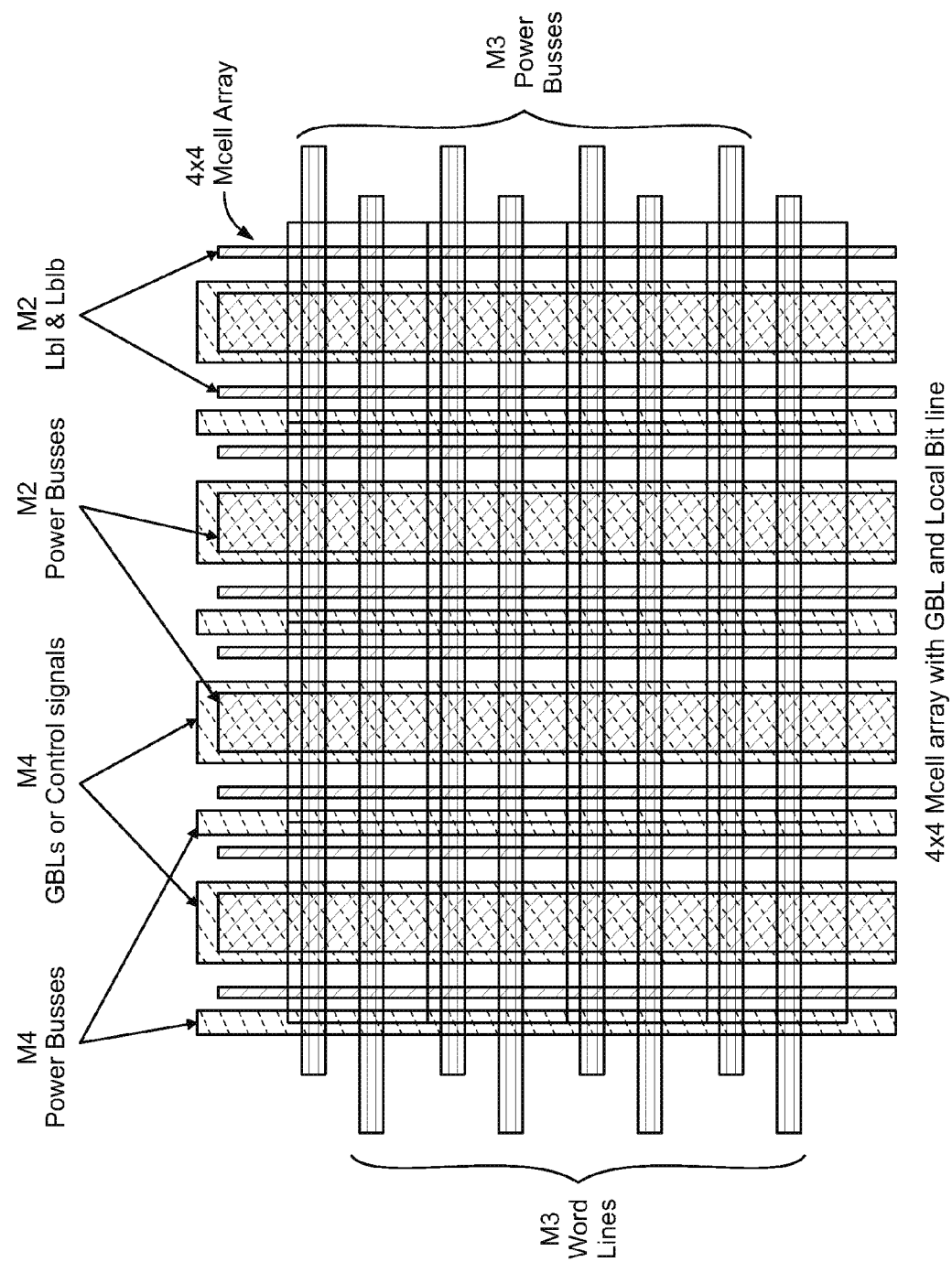

FIGS. 13 and 14 are diagrams of illustrative SRAMs including SBLs, dual-port memory cells and associated read and write pass gates according to disclosed implementations. Referring to FIG. 13, a first implementation involving dual-port memory cells 102 is shown. Here, each section bit line may include local bit line A and its complement 1302, 1304 as well as local bit line B and its complement 1306, 1308 coupled to the memory cells 102. Further, write pass gate circuitry 1320 may be connected between the local bit lines and the local data lines 1318 and read pass gate circuitry 1330 may be connected between the local bit lines and the global bit lines (global bit line A and its complement 1310, 1312 and global bit line B and its complement 1314, 1316).

Write pass gate circuitry 1320 may include transistors/components coupled to a first write pass gate signal 1329 including a first coupling transistor 1322 connected between local bit line A 1302 and the local data line 1318 and a second coupling transistor 1324 connected between the complement local bit line A 1304 and the local data line 1318. Write pass gate circuitry may also include transistors/components coupled to a second write pass gate signal 1329 including a first coupling transistor 1326 connected between local bit line B 1306 and the local data line 1318 and a second coupling transistor 1328 connected between the complement local bit line B 1308 and the local data line 1318. In some embodiments, such coupling transistors 1322, 1324, 1326, 1328 may be NMOS transistors. Further, in certain implementations, such coupling transistors may be connected to the local bit lines via their drains, to enable passing of true (not inverse) local bit line values to the global bit lines.

Read pass gate circuitry 1330 may include transistors/components coupled to a first read pass gate signal 1339 including a first coupling transistor 1332 connected between local bit line A 1302 and global bit line B 1314 and a second coupling transistor 1334 connected between the complement local bit line A 1304 and the complement global bit line B 1316. Read pass gate circuitry 1330 may also include transistors/components coupled to a second read pass gate signal 1339 including a first coupling transistor 1336 connected between local bit line B 1306 and global bit line A 1310 and a second coupling transistor 1338 connected between the complement local bit line B 1308 and global bit line A 1312. In some embodiments, such coupling transistors 1332, 1334, 1336, 1338 may be PMOS transistors. Further, in certain implementations, such coupling transistors may be connected to the local bit lines via their drains, to enable passing of true (not inverse) local bit line values to the global bit lines.

Referring to FIG. 14, a second implementation involving dual-port memory cells 102 is shown. Here, each section bit line may include local bit line A and its complement 1402, 1404 as well as local bit line B and its complement 1406, 1408 coupled to the memory cells 102. Further, a complementary pass gate cell 1420 including write pass gate circuitry and read pass gate circuitry may be connected between the local bit lines and the global bit lines 1410, 1412, 1414, 1416 or the local data lines 1418.

Within the complementary pass gate cell 1420, write pass gate circuitry may include transistors/components coupled to a first of the write pass gate signals 1429 including a first coupling transistor 1422 connected between local bit line A 1402 and the local data line 1418 and a second coupling transistor 1424 connected between the complement local bit line A 1404 and the local data line 1418. Such write pass gate circuitry may also include transistors/components coupled to a second of the write pass gate signals 1429 including a first coupling transistor 1426 connected between local bit line B 1406 and the local data line 1418 and a second coupling transistor 1428 connected between the complement local bit line B 1408 and the local data line 1418. In some embodiments, such coupling transistors 1422, 1424, 1426, 1428 may be NMOS transistors. Further, in certain implementations, such coupling transistors may be connected to the local bit lines via their drains, to enable passing of true (not inverse) local bit line values to the global bit lines.

Also within the complementary pass gate cell 1420, read pass gate circuitry may include transistors/components coupled to a first of the read pass gate signals 1439 including a first coupling transistor 1430 connected between local bit line A 1402 and global bit line B 1414 and a second coupling transistor 1432 connected between the complement local bit line A 1404 and the complement global bit line B 1416. Such read pass gate circuitry may also include transistors/components coupled to a second of the read pass gate signals 1439 including a first coupling transistor 1434 connected between local bit line B 1406 and global bit line A 1410 and a second coupling transistor 1436 connected between the complement local bit line B 1408 and global bit line A 1412. In some embodiments, such coupling transistors 1430, 1432, 1434, 1436 may be PMOS transistors. Further, in certain implementations, such coupling transistors may be connected to the local bit lines via their drains, to enable passing of true (not inverse) local bit line values to the global bit lines.

Additionally, from a fabrication/structural standpoint, SRAMs consistent with the innovations herein may be configured such that the global bit lines and/or control signal lines are formed in layers above or below the memory cells, i.e., on higher/lower level(s). Here, for example, FIGS. 15A-15D illustrate various illustrative implementations wherein the local bit lines and/or the global bit lines or control signal lines are formed above or below the memory cell array. As shown in the illustrated embodiments, local bit lines and power buses may be formed in metal 2 1506, word lines and power buses may be formed in metal 3 1504, and global bit lines, control signal lines and power buses may be formed in metal 4 1502. Moreover, according to some such configurations, in addition to savings such as in chip area and/or cost, improved tracking may be provided in relation to the associated control signal(s) with such structures, especially as against sense amplifier enable signal(s) and the SBL selection signals for SRAMs.

Additionally, according to simulations analysis in the relevant technology, a 1K block (1024) of memory cells arranged into four SBLs in a 2×2 matrix consistent with the innovations herein has approximately 50% less capacitance in comparison to a conventional 1K memory cell bit line. In some implementations, the bit line parasitic capacitance reduction from aforementioned analysis is about 45% that of conventional bit line, and the junction capacitance reduction from aforementioned analysis is about 60% less that of conventional bit line. As such, implementations herein may achieve a total combined capacitance reduction of about 50%. Such analyses also show that a 2K block (2048) of memory cells utilizing the illustrative 2×2 SBL matrices consistent with the innovations herein may have a bit line capacitance that is approximately 50% less than that of a conventional 2K memory cells bit line. Therefore, as a results of present innovations utilizing the sectioned bit line architecture(s) set forth above, systems and methods herein may approximately double the memory array density while maintaining the same speed and operation.

Moreover, in another set of embodiments, SRAM systems and methods may be provided that utilize sectioned bit lines in a hierarchical column memory array. Consistent with such embodiments, systems and methods herein may reduce bit line capacitance and/or improve speed. Here, for example, sectioned bit lines may include a plurality of memory cells that connect onto true and complement local bit lines, where each of the local bit lines couples to the global bit lines. In some implementations, a local sense amplifier may be added between a sectioned bit line and a global bit line, which may further reduce the overall bit line length because the active sectioned bit line is further isolated from the global bit line. A local data driver may be added along with a local sense amplifier to facilitate the writing of new data to memory cells in the SBL. The SBLs with the local sense amplifier and local data drivers may form a mini array on the global bit lines. Structurally, then, an exemplary hierarchical column memory array may include such SBLs and GBLs.

Figure 16:
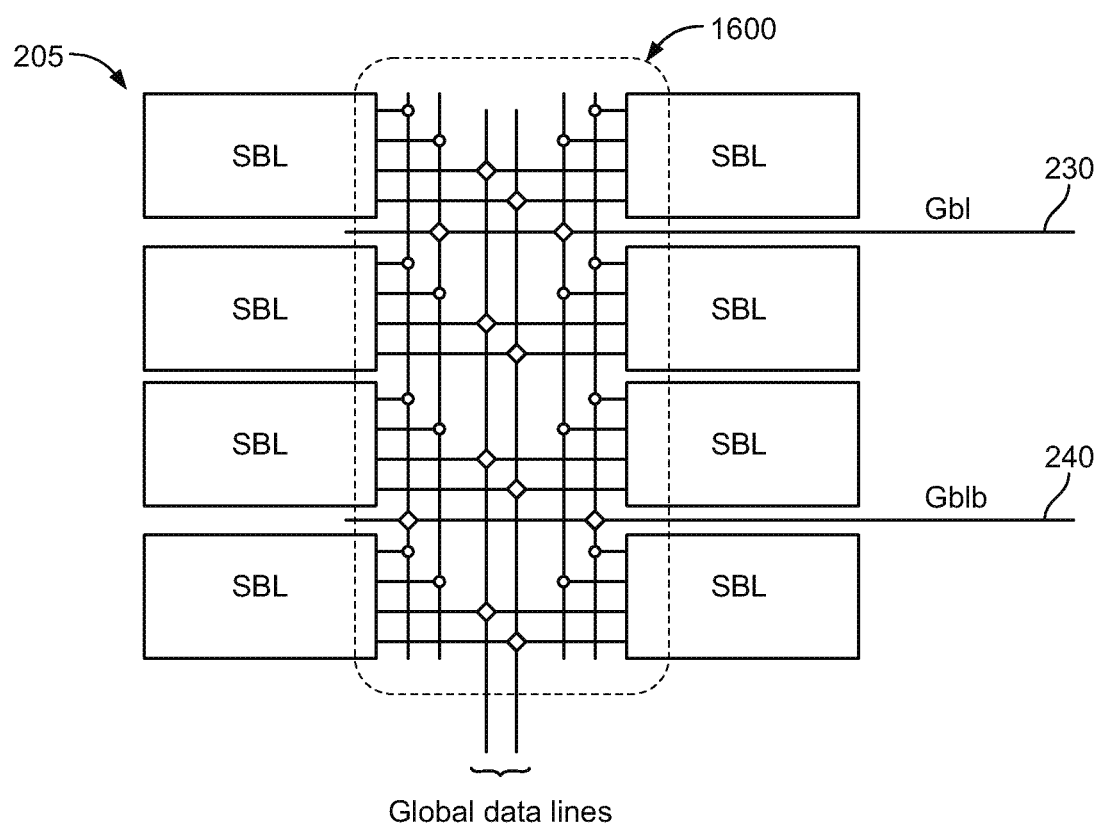
FIG. 16 is a diagram of global bit lines with a local connection of SBLs according to disclosed implementations.

FIG. 16 illustrates the global bit lines with a local connection of SBLs arranged in multiple rows and columns, according to an exemplary implementation. As discussed previously in connection with FIGS. 3 and 6, plural SBLs can be connected on to the global bit line and global complement bit line where the SBLs are arranged in a single row. In this arrangement, the global bit lines have to be implemented on the top of the local bit lines of the SBL and the width of the global bit line is also limited to the local bit line width of the SBL. FIG. 16 discloses an implementation that improves on the RC time constant of the global bit line by arranging the SBL into multiple rows and columns such that the global bit line width is not limited to a local bit line width. In FIG. 16, two rows and four columns of SBLs 205 are connected onto the global bit lines 230, 240 via the local connection 1600. In such a configuration, the RC time constant of the global bit line can be optimized with a wider width such that the global bit line is much shorter. Furthermore, by arranging the SBLs to include a plurality of rows and columns is that more SBLs can be accommodated on the same global bit line length of the single column.

In some implementations, for example, eight SBLs in four rows may be connected locally before connection to the corresponding GBLs. One implementation of the detailed local connection of the eight SBLs is illustrated in FIG. 8. Within the local connection, eight pairs of read pass gates are provided coupled to local data lines Ldl and Ldlb. When one of the eight pairs of read pass gates is enabled, the selected local bit lines are connected to the Ldl and Ldlb. Only one pair of pass gates is enabled at any one time, no matter whether it is read or write, and thus only one SBL is coupled onto the GBL at any one time. The selection of SBL and the pass gates may be achieved through column decoding. The local connection is not limited to eight SBLs and can be expanded to sixteen SBLs, thirty-two SBLs, etc. However, a larger number of SBLs requires a larger space to accommodate the larger number of column decoding lines and also increases the capacitance of the local connection. As such, for certain implementations, the total number of SBLs in the local connection 1600 may be limited to eight or sixteen.

Figure 17:
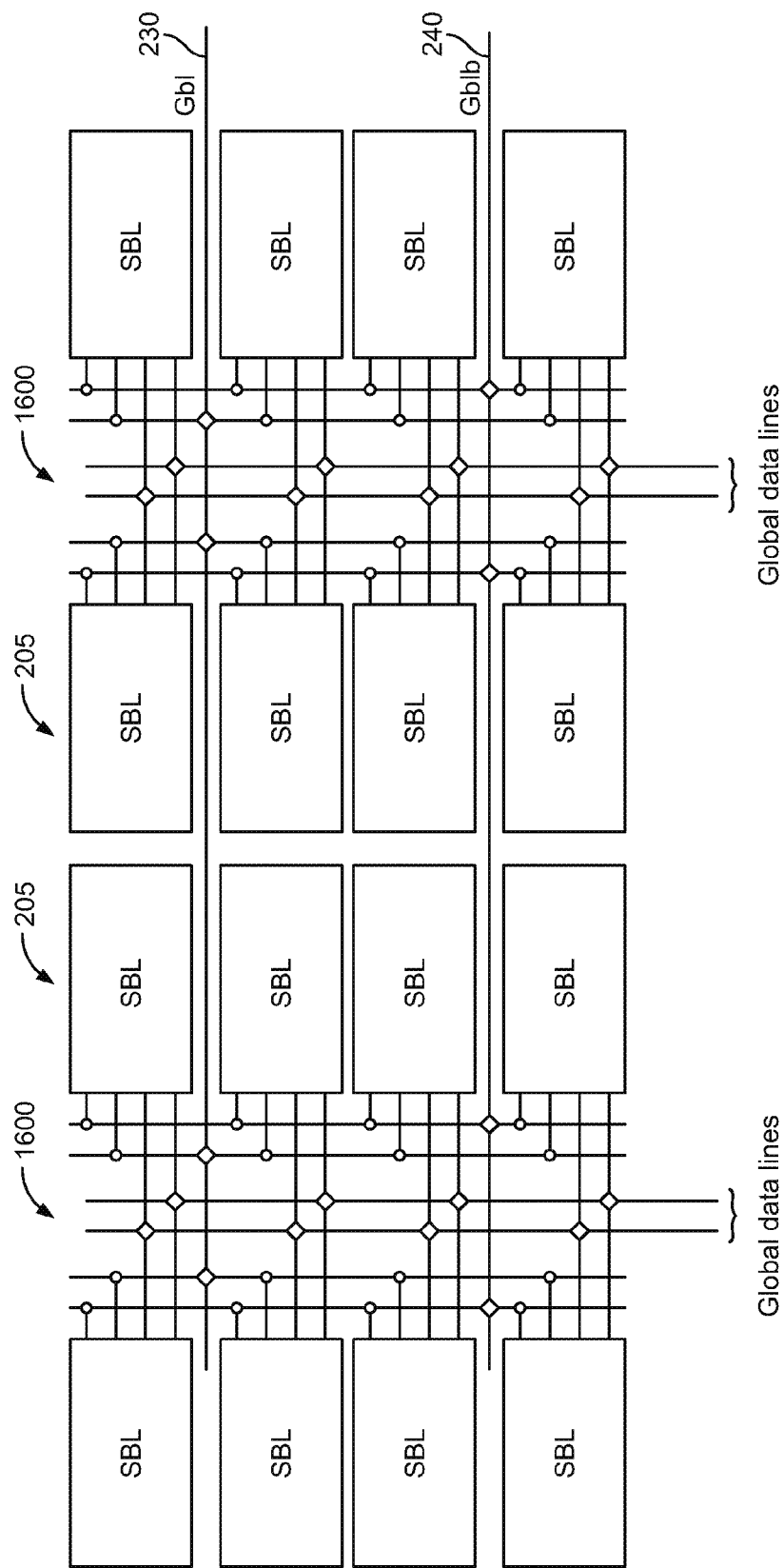
FIG. 17 is a diagram of global bit lines with multiple rows and columns of SBLs according to disclosed implementations.

Next, FIG. 17 illustrates a configuration including a plurality of local connections on the global bit lines, according to one exemplary implementation. Providing multiple local connections is difficult in a large array because the selection and de-selection of SBLs in a local connection is achieved solely by the column decoding which means the column decoding of each of the local connections must be unique. The difficulty increases as the number of local connections increases. Therefore, there is a need to simplify the decoding of the local connections and improve upon the RC time constant. Aspects of the present innovations may solve such issues by including a local sense amplifier and local data drivers are implemented for the local connections as a means to add control.

Figure 18:
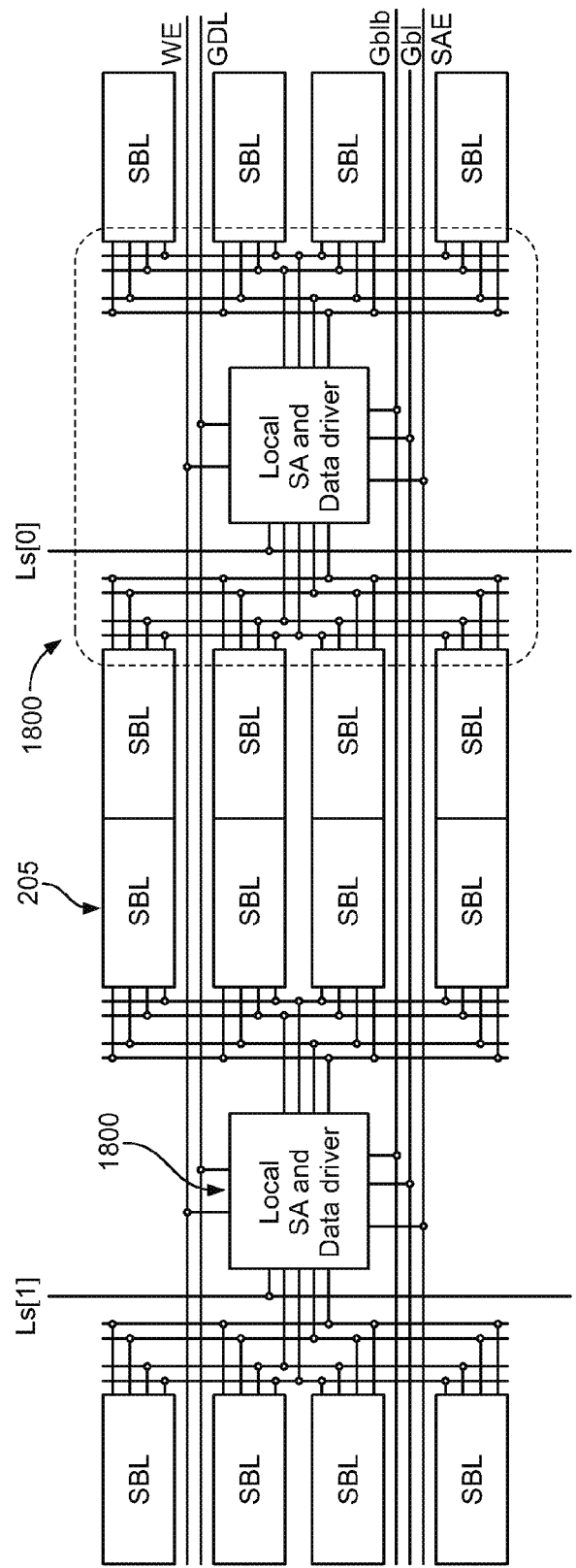
FIG. 18 is a diagram of a hierarchical column array of global bit lines with local sense amplifiers and local data drivers according to disclosed implementations.
Figure 19A:
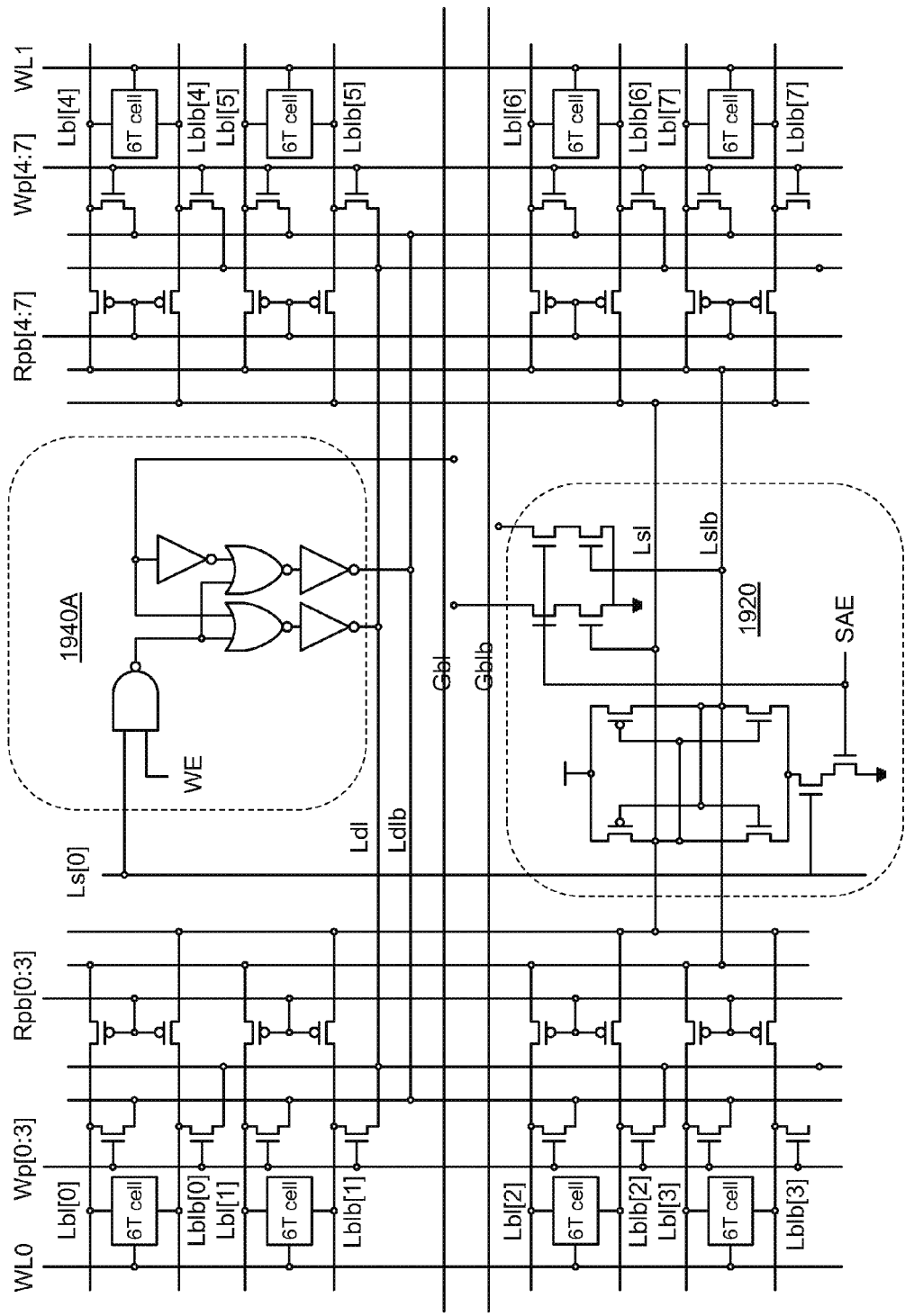
FIGS. 19A and 19B are diagrams illustrating local connectivity including the local sense amplifier and local data driver according to disclosed implementations.
Figure 19B:
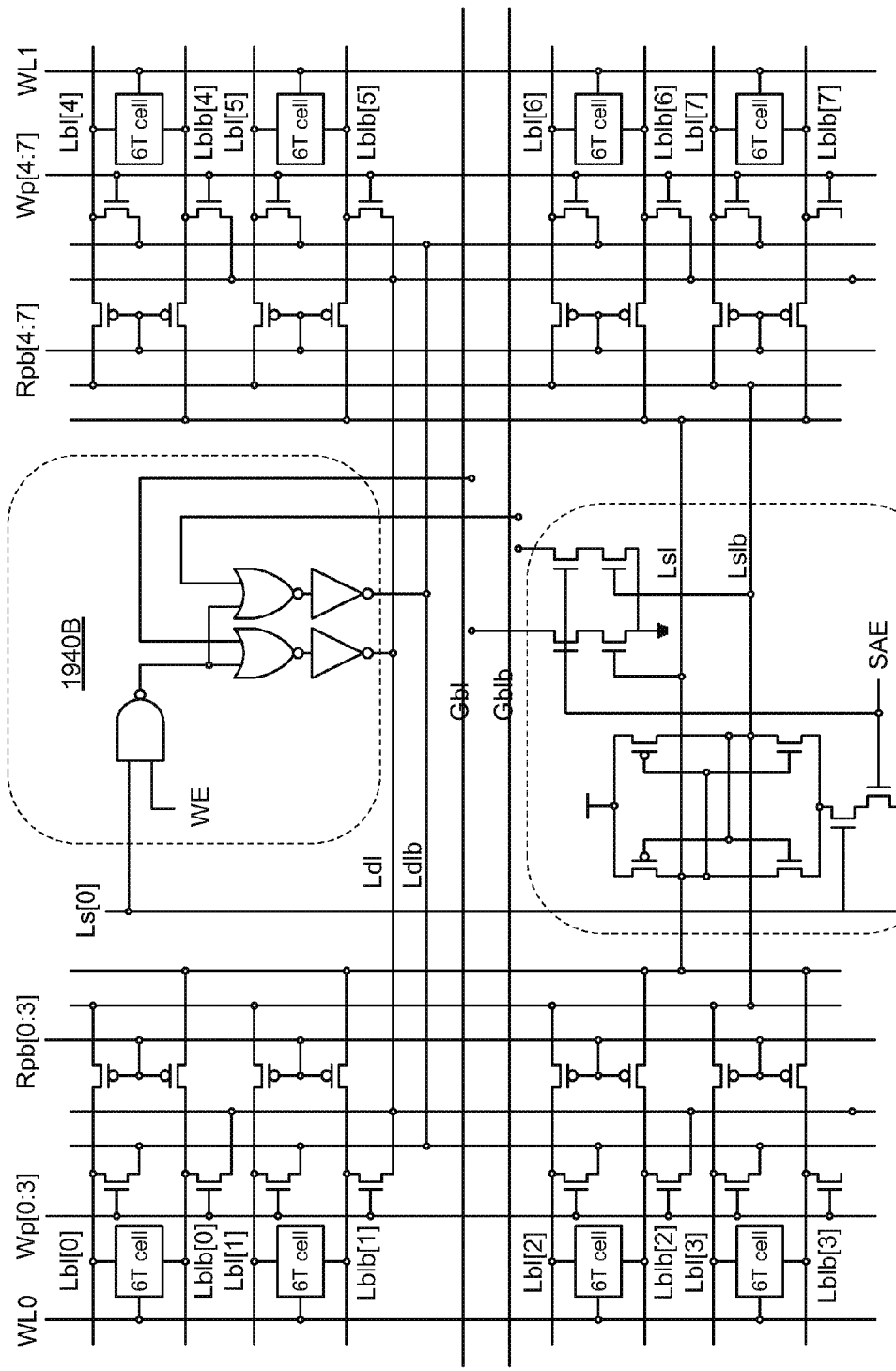

FIGS. 18, 19A and 19B disclose implementations of the local connection 1600 with a local sense amplifier and data driver 1800, according to exemplary implementations. The local connection 1600 in FIG. 18 is controlled by the decoded local select LS[0] and LS[1]. Hence, both local connections illustrated can share the same column decoding without bus contention occurring on the GBLs. Further, with the sense amplifier enable SAE and the write enable WE, the read and write operations may be controlled individually in each local connection 1600.

FIGS. 19A and 19B illustrates one detailed arrangement of a local sense amplifier 1920 and local data driver 1940 (1940A or 1940B), according to exemplary implementations. The increase in area due to the local sense amplifier 1920 and local data driver 1940 in a local connection 1600 may be minimized by the configuration shown in FIG. 19. The decoded local signal LS[0] enables either the sense amplifier (read operation) or the data drivers (write operation). The read and write enable signals SAE and WE in FIG. 18 are able to reach the local sense amplifier 1920 and data driver 1940 in each local connection 1800 via the top of the SBLs due to the multiple column format of the SBLs. Accordingly, from the point of view of the GBL, the read and write enables become the conventional decoding of the GBL.

Furthermore, in FIGS. 19A and 19B, the read and write operations of the SBL with local sense amplifier 1920 and data drivers 1940 operate the same as that of a regular memory array. Before the read operation begins, the local bit lines in the SBLs and Lsl and Lslb are precharged to Vdd. Memory cells are turned on by an active word line WL0, for example. At the same time, the read pass gate enable such as Rpb[0] of Rpbp[0:7] enables one of the eight pairs of read pass gates. Thus, the selected SBL with the selected memory cell is coupled onto the Lsl and the Lslb. The prerequisite of activation of the local sense amplifier 1920 is the activation of the signal LS[0]. When both the LS[0] and SAE are active, logic high in this example, the local voltage sense amplifier is enabled. Although a voltage sense amplifier is used in this example, other types of sense amplifiers may be implemented based on design requirements. With proper timing, the sense amplifier enables the SAE signal to turn on the local voltage sense amplifier to amplify the voltage changes presented on the Lsl and Lslb by the memory cell. In the meantime, the amplified signal on the Lsl and Lslb is transferred to the global bit lines.

Similarly, for the write operation, the local bit lines at the start in the SBLs, Ldl and Ldlb are precharged to Vdd. Memory cells are turned on by an active word line, for example WL0. At the same time, the write pass gate enable such as Rpb[0] of Rpb[0:7] enables one of the eight pairs of write pass gates. Thus, the selected SBL with the selected memory cell are coupled to the Ldl and Ldlb. All other pass gates should be inactive during this time to ensure proper writing operation. When both LS[0] and WE are active, logic high in this example, the local data drivers convert the data on the global data line GDL into differential data on the Ldl and Ldlb that are needed for write operation. Writing on the memory cell is thereby initiated when WE is active. As shown in the illustrative implementation of FIGS. 19A and 19B, the global bit line may be used as global data line, thus the need for the global data line is eliminated.

Figure 20A:
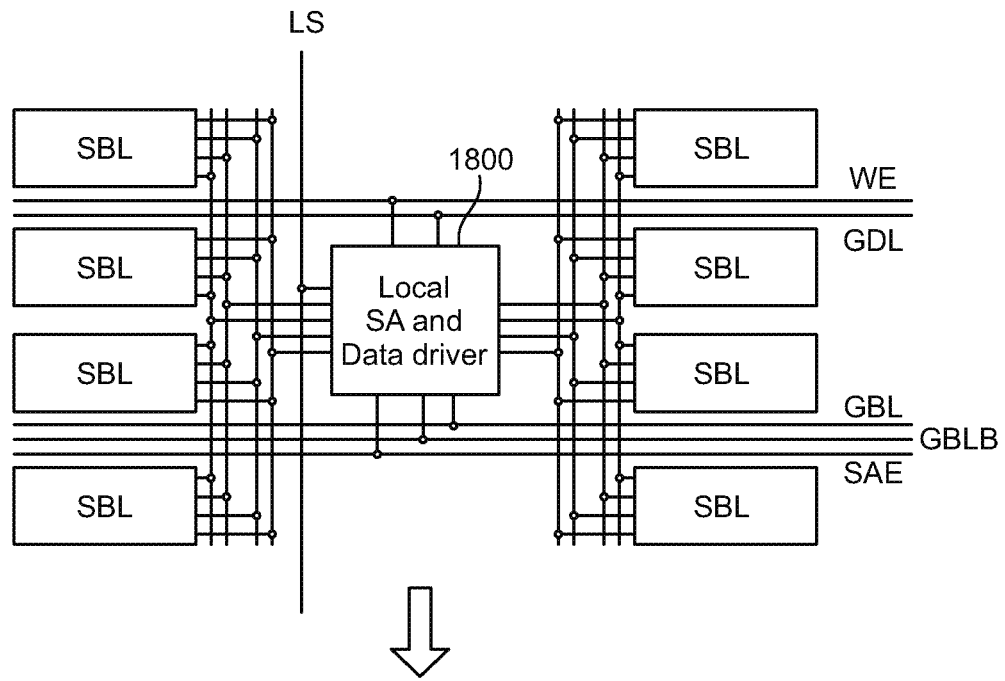
FIGS. 20A and 20B are diagrams of the local section bit line block according to disclosed implementations.
Figure 20B:
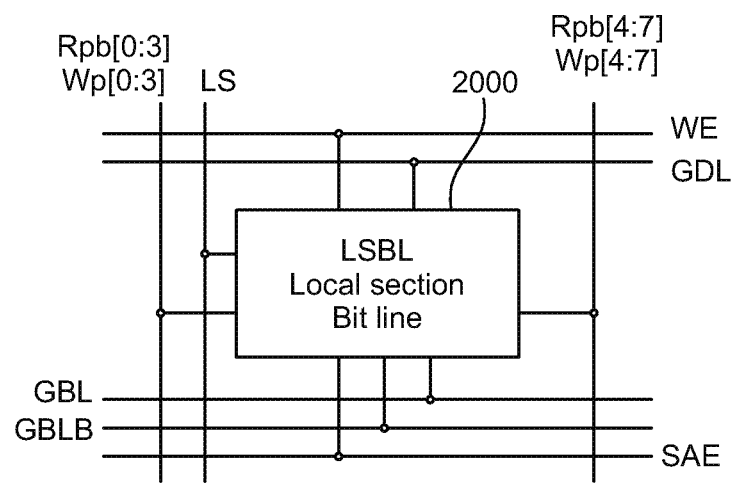
Figure 21:
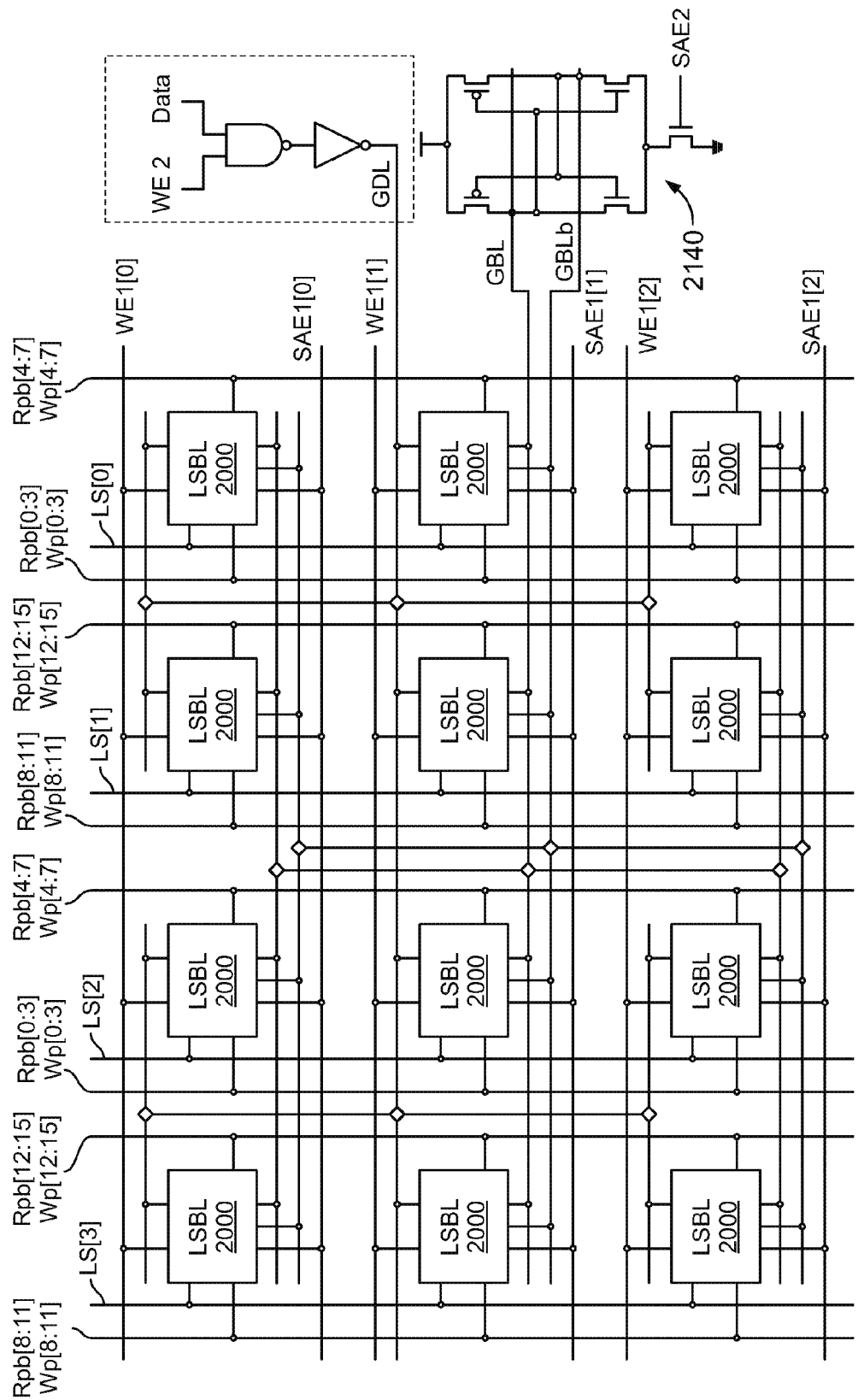
FIG. 21 is a diagram of a global bit line with a sense amplifier and global data line driver according to disclosed implementations.

The local section bit line block LSBL 2000 is illustrated in FIG. 20. The LSBL 2000 includes a plurality of SBLs, a local sense amplifier 1920, a data driver 1940 and corresponding enable signals WE and SAE. FIG. 21 illustrates an array of LSBLs with a local column select, local select, and read and write enables. A global sense amplifier 2140 may be provided at the end of the GBL to receive the amplified signals from the local sense amplifiers 1920 in the LSBLs. The local sense amplifier 1920 may serve as the pre-amplifier to the GBL sense amplifier 2140. In a conventional memory array, there would be provided pass gates between the GBL and the global bit line sense amplifier 2140. However, with the configuration of the present invention, pass gates are unnecessary. The SAE2 and WE2 are respective read and write enables for the global sense amplifier 2140 and global data line driver 2120.

Figure 22:
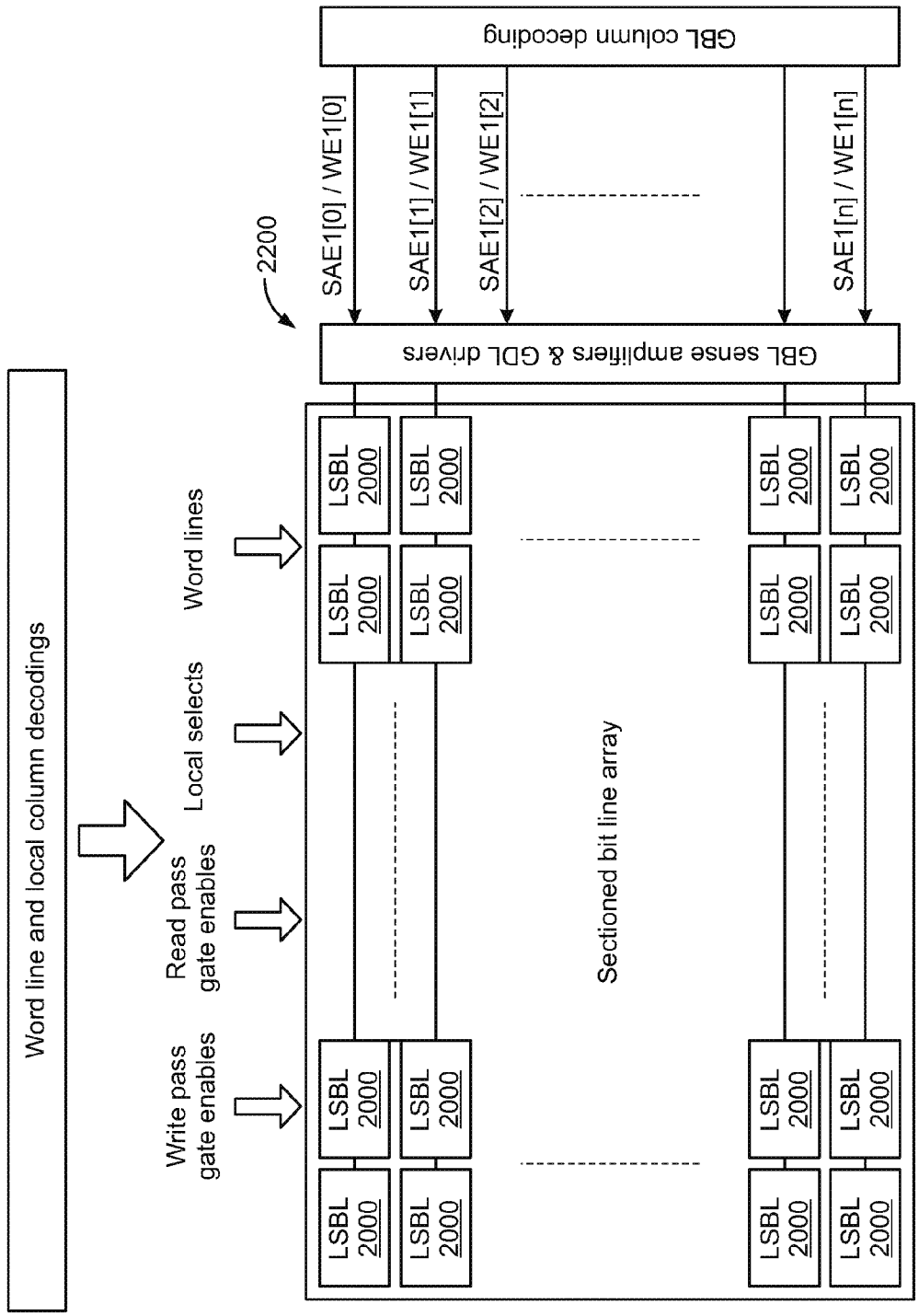
FIG. 22 is a diagram of a hierarchical column memory array according to disclosed implementations.

Next, FIG. 22 is a diagram of a hierarchical column array of SBLs with local sense amplifiers and data drivers. In particular, the local select LS, write enable WE and sense enable signal SAE form an XY grid to provide LSBL array decoding. The word line decoding generates decoded word lines to turn on the memory cells in the SBL. The local column decoding generates the decoded read and write pass gate enables as well as the decoded local select signals in the word line direction for the LSBL array. The GBL column decoding generates the GBL read and write enables WE1 and SAE1 as well as the GBL sense amplifier enable and global data driver enable SAE2 and WE2, respectively, in the column direction. The GBL sense amplifier 2140 will receive the amplified signal from the local sense amplifier 1920 on the GBL to complete the read operation and then transfer the read data to the periphery of the memory array. The hierarchical column scheme organizes the LSBL into a large hierarchical array where the LSBLs are linked together where the LSBL is formed by a plurality of SBLs, local sense amplifiers and local data drivers.

Systems and methods involving an SBL, local sense amplifier and/or a local data driver provide many advantages. For example, the local sense amplifier amplifies signals from the SBL and isolates the SBL from the global bit lines to improve not only the RC time constant of the SBL, but also that of the GBL. The local data drivers may convert the global data line GDL into local data lines Ldl and Ldlb, thereby improving data distribution over a large array. Power consumption may also be reduced as unnecessary charging and discharging of local data lines is eliminated. Thus, memory cell stability is improved and, further, the local bit line of the SBL may be less capacitive. As such, the hierarchical column array systems and methods described above may provide flexibility, reduce bit line capacitance, bit line length and power usage, and/or result in improved memory cell stability.

While various embodiments have been described above, it should be understood that they have been presented by way of example and not limitation. It will be apparent to persons skilled in the relevant art(s) that various changes in form and detail can be made therein without departing from the spirit and scope. For example, other memory cells beside 6T memory cells may be used in sectioned bit line, such as 4T, dual ports, and 1T memory cells. Also, the sectioned bit line architecture described herein may be adapted into different memory array configurations and memory compilers. In fact, after reading the above description, it will be apparent to one skilled in the relevant art(s) how to implement alternative embodiments. Thus, the present embodiments should not be limited by any of the above-described embodiments.

In addition to the above SRAMs and SRAM architecture, the present inventions also include, inter alia, methods of SRAM operation, methods of fabricating SRAM devices consistent with the features and/or functionality herein, products (such as SRAMs or products embodying SRAMs), and products produced via such processes. By way of example and not limitation, methods of SRAM fabrication herein may include known SRAM manufacturing processes such as in CMOS technologies involving aspects such as p-mos and n-mos transistor formation, multiple metallization layers and/or local interconnects, among others. A variety of exemplary/staple processes here, for example, being set forth in the backgrounds/disclosures of U.S. Pat. Nos. 4,794,561, 5,624,863, 5,994,178, 6,001,674, 6,117,754, 6,127,706, 6,417,549, 6,894,356, and 7,910,427 as well as U.S. patent application publication No. US2007/0287239A1, which are incorporated herein by reference.

Further, it should be understood that any figures which highlight functionality and advantages are presented for example purposes only. The disclosed methodologies and systems are each sufficiently flexible and configurable such that they may be utilized in ways other than those shown.

Aspects of the method and system described herein, such as the logic, may be implemented as instructions/signals associated with or functionality related to a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

It should also be noted that the terms "a", "an", "the", "said", etc. signify "at least one" or "the at least one" in the disclosure and claims.

Although certain presently preferred implementations of the invention have been specifically described herein, it will be apparent to those skilled in the art to which the invention pertains that variations and modifications of the various implementations shown and described herein may be made without departing from the spirit and scope of the invention. Accordingly, it is intended that the invention be limited only to the extent required by the appended claims and the applicable rules of law.

The invention claimed is:

1. An SRAM memory device comprising:
 a local section bit line including:
  a plurality of sectioned bit lines (SBLs), each comprising:
   a local bit line;
   one or more memory cells connected to the local bit line;
   a local complement bit line connected to the memory cell; and
   a pass gate coupled to the local bit line;
  a local sense amplifier;
  a local shared data driver that drives a local data line, wherein the local shared driver is separate from the local sense amplifier and connected to the local bit line via a write pass gate; and
  a global bit line;
 wherein the local sense amplifier is configured to amplify a signal on a local sense line and provide an output to the global bit line, wherein the local sense line is provided between the local bit line and the global bit line.

2. The device of claim 1 wherein the pass gates are configured to connect and/or isolate the sectioned bit line and local sense line.

3. The device of claim 2 wherein the one or more memory cells comprise:
 2 or more LSBLs arranged in direction along the bit line (Y direction).

4. The device of claim 2 further comprising at least one multiple level sense amplifiers coupled with one or more of the global bit lines and/or the sectioned bit lines.

5. The device of claim 4 wherein the pass gates are configured, via coupling to at least one selection signal line, to connect the sectioned bit lines to the local sense line such that a selected pass gate of a selected SBL, when turned on, selectively passes data of the plurality of memory cells of the selected SBL to the local sense line, and unselected pass gates of unselected SBLs, when turned off, isolate the unselected SBLs from the local sense line.

6. The device of claim 2 further comprising at least one multiple level data driver coupled with one or more of the global bit lines and/or the sectioned bit lines.

7. The device of claim 2 further comprising a single global bit line sense amplifier for one or more of the local section bit lines (LSBLs).

8. The device of claim 2 further comprising a single global data driver for one or more of the local sectioned bit lines (LSBLs).

9. The device of claim 2 wherein the one or more memory cells comprise:
at least one LSBL arranged in a direction of a word line (X direction).

10. The device of claim 2 further comprising at least one local sense amplifier and/or at least one local data driver.

11. The device of claim 2 wherein at least two or more local sense amplifiers and/or at least two or more local data drivers are configured for selection by X and Y addresses.

12. The device of claim 2, further comprising a global data line.

13. The device of claim 2, wherein the global bit line is configured to be used as a global data line.

14. The device of claim 2 further comprising multiple level column decoding circuit on the global bit line.

15. The device of claim 14 wherein the global bit line is arranged in a same direction as the local bit line(s).

16. The device of claim 1 wherein the one or more memory cells comprise:
2 or more LSBLs arranged in direction along the bit line (Y direction).

17. The device of claim 1 wherein the one or more memory cells comprise:
at least one LSBL arranged in a direction of a word line (X direction).

18. The device of claim 1 further comprising at least one local sense amplifier and/or at least one local data driver.

19. The device of claim 1 wherein at least two or more local sense amplifiers and/or at least two or more local data drivers are configured for selection by X and Y addresses.

20. The device of claim 1, further comprising a global data line.

21. The device of claim 1, wherein the global bit line is configured to be used as a global data line.

22. The device of claim 1 further comprising multiple level column decoding circuit on the global bit line.

23. The device of claim 22 wherein the global bit line is arranged in a same direction as the local bit line(s).

24. The device of claim 1 further comprising at least one multiple level sense amplifiers coupled with one or more of the global bit lines and/or the sectioned bit lines.

25. The device of claim 24 wherein the pass gates are configured, via coupling to at least one selection signal line, to connect the sectioned bit lines to the local sense line such that a selected pass gate of a selected SBL, when turned on, selectively passes data of the plurality of memory cells of the selected SBL to the local sense line, and unselected pass gates of unselected SBLs, when turned off, isolate the unselected SBLs from the local sense line.

26. The device of claim 1 further comprising at least one multiple level data driver coupled with one or more of the global bit lines and/or the sectioned bit lines.

27. The device of claim 1 further comprising a single global bit line sense amplifier for one or more of the local section bit lines (LSBLs).

28. The device of claim 1 further comprising a single global data driver for one or more of the local sectioned bit lines (LSBLs).

29. A local section bit line (LSBL) of an SRAM including:
a plurality of sectioned bit lines (SBLs), each comprising:
a local bit line;
one or more memory cells connected to the local bit line;
a local complement bit line connected to the memory cell; and
a pass gate coupled to the local bit line;
a local sense amplifier;
a local shared data driver that drives a local data line, wherein the local shared data driver is separate from the local sense amplifier and connected to the local bit line via a write pass gate;
a global bit line;
wherein the local sense amplifier is configured to amplify a signal on a local sense line and provide an output to the global bit line, wherein the local sense line is provided between the local bit line and the global bit line.

30. The device of claim 29 wherein the pass gates are configured to connect and isolate the sectioned bit line and local sense line.

31. The local sectioned bit line of claim 30 wherein the one or more memory cells are configured such that 2 or more LSBLs are arranged in direction along the bit line (Y direction).

32. The local sectioned bit line of claim 30 wherein the one or more memory cells are configured such that the LSBL is arranged in a direction of a word line (X direction).

33. The local sectioned bit line of claim 30 further comprising at least one local sense amplifier and/or at least one local data driver.

34. The local sectioned bit line of claim 30 wherein at least two or more local sense amplifiers and/or at least two or more local data drivers are configured for selection by X and Y addresses.

35. The local sectioned bit line of claim 30, further comprising a global data line.

36. The local sectioned bit line of claim 30, wherein the global bit line is configured to be used as a global data line.

37. The local sectioned bit line of claim 30 further comprising multiple level column decoding circuit on the global bit line.

38. The local sectioned bit line of claim 37 wherein the global bit line is arranged in a same direction as the local bit line(s).

39. The local sectioned bit line of claim 30 further comprising at least one multiple level sense amplifiers coupled with one or more of the global bit lines and/or the sectioned bit lines.

40. The local sectioned bit line of claim 39 wherein the pass gates are configured, via coupling to at least one selection signal line, to connect the sectioned bit lines to the local sense line such that a selected pass gate of a selected SBL, when turned on, selectively passes data of the plurality of memory cells of the selected SBL to the local sense line, and unselected pass gates of unselected SBLs, when turned off, isolate the unselected SBLs from the local sense line.

41. The local sectioned bit line of claim 30 further comprising at least one multiple level data driver coupled with one or more of the global bit lines and/or the sectioned bit lines.

42. The local sectioned bit line of claim 30 further comprising a coupling to a single global bit line sense amplifier for the local section bit line.

43. The local sectioned bit line of claim 30 further comprising a coupling to a single global data driver for the local sectioned bit line.

44. The local sectioned bit line of claim 29 wherein the one or more memory cells are configured such that 2 or more LSBLs are arranged in direction along the bit line (Y direction).

45. The local sectioned bit line of claim 29 wherein the one or more memory cells are configured such that the LSBL is arranged in a direction of a word line (X direction).

46. The local sectioned bit line of claim 29 further comprising at least one local sense amplifier and/or at least one local data driver.

47. The local sectioned bit line of claim 29 wherein at least two or more local sense amplifiers and/or at least two or more local data drivers are configured for selection by X and Y addresses.

48. The local sectioned bit line of claim 29, further comprising a global data line.

49. The local sectioned bit line of claim 29, wherein the global bit line is configured to be used as a global data line.

50. The local sectioned bit line of claim 29 further comprising multiple level column decoding circuit on the global bit line.

51. The local sectioned bit line of claim 50 wherein the global bit line is arranged in a same direction as the local bit line(s).

52. The local sectioned bit line of claim 29 further comprising at least one multiple level sense amplifiers coupled with one or more of the global bit lines and/or the sectioned bit lines.

53. The local sectioned bit line of claim 52 wherein the pass gates are configured, via coupling to at least one selection signal line, to connect the sectioned bit lines to the local sense line such that a selected pass gate of a selected SBL, when turned on, selectively passes data of the plurality of memory cells of the selected SBL to the local sense line, and unselected pass gates of unselected SBLs, when turned off, isolate the unselected SBLs from the local sense line.

54. The local sectioned bit line of claim 29 further comprising at least one multiple level data driver coupled with one or more of the global bit lines and/or the sectioned bit lines.

55. The local sectioned bit line of claim 29 further comprising a coupling to a single global bit line sense amplifier for the local section bit line.

56. The local sectioned bit line of claim 29 further comprising a coupling to a single global data driver for the local sectioned bit line.

* * * * *